United States Patent
Nakata et al.

(10) Patent No.: US 10,429,738 B2
(45) Date of Patent: Oct. 1, 2019

(54) FILTRATION FILTER, FILTRATION METHOD, PRODUCTION METHOD OF PURIFIED LIQUID CHEMICAL PRODUCT FOR LITHOGRAPHY, AND METHOD OF FORMING RESIST PATTERN

(71) Applicant: TOKYO OHKA KOGYO CO., LTD., Kawasaki-shi (JP)

(72) Inventors: Akihiko Nakata, Kawasaki (JP); Akihito Morioka, Kawasaki (JP); Tsukasa Sugawara, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/277,528

(22) Filed: Sep. 27, 2016

(65) Prior Publication Data

US 2017/0090293 A1    Mar. 30, 2017

(30) Foreign Application Priority Data

Sep. 30, 2015  (JP) ................ 2015-192889
Sep. 30, 2015  (JP) ................ 2015-192890
Sep. 30, 2015  (JP) ................ 2015-192891
Sep. 30, 2015  (JP) ................ 2015-192892

(51) Int. Cl.

| | | |
|---|---|---|
| *B01D 24/00* | (2006.01) | |
| *G03F 7/32* | (2006.01) | |
| *B01D 61/00* | (2006.01) | |
| *B01D 71/40* | (2006.01) | |
| *G03F 7/004* | (2006.01) | |
| *G03F 7/039* | (2006.01) | |
| *G03F 7/09* | (2006.01) | |
| *G03F 7/16* | (2006.01) | |
| *G03F 7/20* | (2006.01) | |
| *G03F 7/40* | (2006.01) | |
| *B01D 67/00* | (2006.01) | |
| *B01D 69/02* | (2006.01) | |
| *B01D 71/64* | (2006.01) | |
| *B32B 5/16* | (2006.01) | |
| *C08J 9/26* | (2006.01) | |
| *G03F 7/00* | (2006.01) | |

(52) U.S. Cl.
CPC ............ *G03F 7/322* (2013.01); *B01D 61/00* (2013.01); *B01D 67/003* (2013.01); *B01D 67/0032* (2013.01); *B01D 69/02* (2013.01); *B01D 71/40* (2013.01); *B01D 71/64* (2013.01); *B32B 5/16* (2013.01); *C08J 9/26* (2013.01); *G03F 7/00* (2013.01); *G03F 7/0045* (2013.01); *G03F 7/0397* (2013.01); *G03F 7/091* (2013.01); *G03F 7/16* (2013.01); *G03F 7/162* (2013.01); *G03F 7/168* (2013.01); *G03F 7/2006* (2013.01); *G03F 7/40* (2013.01); *B01D 67/0002* (2013.01); *B01D 67/0023* (2013.01); *B01D 67/0088* (2013.01); *B01D 67/0093* (2013.01); *B01D 2323/12* (2013.01); *B01D 2323/18* (2013.01); *B01D 2325/021* (2013.01); *C08J 2201/04* (2013.01)

(58) Field of Classification Search
CPC ....... B01D 67/003; B01D 61/02; B01D 69/02
USPC ........................................................ 430/327
See application file for complete search history.

(56) References Cited

U.S. PATENT DOCUMENTS

| | | |
|---|---|---|
| 7,838,606 B2 | 11/2010 | Yamagishi et al. |
| 2006/0014098 A1 | 1/2006 | Hada et al. |
| 2007/0036959 A1 | 2/2007 | Yamato et al. |
| 2010/0048745 A1 | 2/2010 | Yamada et al. |
| 2010/0303520 A1* | 12/2010 | Miyauchi ............... C08G 73/10 521/50 |
| 2013/0045355 A1* | 2/2013 | Ohya ................. B01D 67/0006 428/116 |
| 2013/0078572 A1 | 3/2013 | Shimizu et al. |
| 2014/0147793 A1 | 5/2014 | Nakamura et al. |
| 2016/0185932 A1 | 6/2016 | Sugawara |

FOREIGN PATENT DOCUMENTS

| | | |
|---|---|---|
| CN | 102417604 A | 4/2012 |
| JP | B-4637476 | 2/2011 |
| JP | A-2012-111790 | 6/2012 |
| WO | WO 2015/020101 A1 | 2/2015 |

OTHER PUBLICATIONS

Search Report in European Patent Application No. 16191033.6, dated Mar. 7, 2017.
Byron Gates et al: "Fabrication and Characterization of Porous Membranes with Highly Ordered Three-Dimensional Periodic Structures", Chemistry of Materials, vol. 11, No. 10, Oct. 1, 1999, pp. 2827-2836, XP055200681, ISSN: 0897-4756, DOI: 10.1021/cm990195d.
Search Report in European Patent Application No. 16191033.6, dated Jul. 7, 2017.

* cited by examiner

*Primary Examiner* — Daborah Chacko-Davis
(74) *Attorney, Agent, or Firm* — Knobbe, Martens, Olson & Bear LLP

(57) ABSTRACT

A filtration filter used for filtering a liquid chemical for lithography, provided with a polyimide resin porous membrane; a filtration method including allowing a liquid chemical for lithography to pass through the filtration filter; and a production method of a purified liquid chemical product for lithography, including filtering a liquid chemical for lithography by the filtration method.

19 Claims, 2 Drawing Sheets

FILTRATION FILTER, FILTRATION METHOD, PRODUCTION METHOD OF PURIFIED LIQUID CHEMICAL PRODUCT FOR LITHOGRAPHY, AND METHOD OF FORMING RESIST PATTERN

TECHNICAL FIELD

The present invention related to a filtration filter, a filtration method, a production method of a purified liquid chemical product for lithography, and a method of forming resist pattern Priority is claimed on Japanese Patent Application Nos. 2015-192889, 2015-192890, 2015-192891 and 2015-192892, filed Sep. 30, 2015, the contents of which are incorporated herein by reference.

DESCRIPTION OF RELATED ART

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, pattern miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production. Furthermore, research, is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid generator component that generates acid upon exposure.

As miniaturization of pattern progress, improvement will be demanded for resist materials with respect to not only various lithography properties, but also suppressing generation of defects.

The term "defects" refers to general deficiencies within a resist film that are detected when observed from directly above the developed resist pattern using, for example, a surface defect detection apparatus (product name: "KLA") manufactured by KLA-TENCOR Corporation. Examples of these deficiencies include deficiencies caused by adhesion of foreign matters and precipitates on the surface of the resist pattern, such as post-developing scum (residual resist), foam and dust; deficiencies related to resist pattern shape, such as bridges formed between line patterns, and filling-up of holes of a contact hole pattern; and color irregularities of a pattern.

In addition, in resist materials, there were problems of storage stability, namely, minute particles of foreign matters are generated while storing a resist solution (resist composition in the form of liquid), and the improvement thereof is desired.

Conventionally, in the production of a resist composition, for removing foreign matted, purification is typically conducted by allowing the resist composition to pass through a filter. However, in a method of allowing a resist composition to pass through a membrane filter or a depth filter which was not conventionally used, it was not satisfactory to suppress generation of defects on a resist pattern after developing.

For suppressing generation of defects on a resist pattern, and responding to the demands of storage stability of a resist material, there has been proposed a production method of a resist composition including a step of allowing the resist material to pass through a nylon filter, and a step of allowing the resist material to pass through a polyolefin resin filter or a fluorine resin filter (see Patent Literature 1).

Further, in the formation of a resist pattern, various liquid chemicals for lithography are used, such as resin solution containing a resin, developing solution, solvent for a resist, and a pre-wetting solvent. For removing foreign matters (impurities) such as particles which got mixed with such liquid chemicals, methods using a filter have been conventionally used.

As the miniaturization of patterns proceed, the presence of such impurities in the liquid chemicals have influence in the formation of a resist pattern.

DOCUMENTS OF RELATED ART

Patent Literature

[Patent Literature 1] Japanese Patent No. 4637476

SUMMARY OF THE INVENTION

As further progress is made in lithography techniques and miniaturization of resist patterns, in the case where a resist pattern having a size of from several tens to several hundreds of nanometers is formed, deficiencies such as generation of scums and microbridges after developing become significant. Therefore, there is more need to obtain a technique which can suppress generation of defects on a resist pattern after developing.

The present invention takes the above circumstances into consideration, with an object of providing a filtration filter and a filtration method which can more reliably remove impurities, a production method of a purified liquid chemical product for lithography with reduced impurities, and a method of forming resist pattern.

As a result of the studies of the present inventors, the present inventors have found that, by purifying a chemical liquid for lithography, such as a resist composition, a developing solution, a solvent for resist or a pre-wetting solvent by allowing the liquid chemical to pass through a filter provided with a polyimide resin porous membrane, generation of foreign matters in the form of particles during storage could be significantly suppressed (the storage stability is significantly improved), as compared to the case where the liquid chemical is purified by allowing the liquid chemical to pass through a conventionally used membrane filter or a depth filter. The present invention has been completed based on this finding.

Further, as a result of the studies of the present inventors, the present inventors have found that, by using a resist pattern which has been purified by passing through a filter provided with a polyamide resin porous membrane in the formation of a resist pattern, generation of scums and microbridges after developing can be significantly suppressed, as compared to the case where the resist composition is purified by allowing the resist composition to pass through a conventionally used membrane filter or a depth filter. The present invention has been completed based on this finding.

As a result of the studies of the present inventors, the present inventors have found that, by purifying a liquid chemical for lithography, such as a resist composition, a developing solution, a solvent for resist or a pre-wetting solvent by allowing the liquid chemical to pass through a filter having a porous structure in which adjacent spherical cells are mutually communicating, generation of foreign matters in the form of particles during storage could be significantly suppressed (the storage stability is significantly improved), as compared to the case where the liquid chemical is purified by allowing the liquid chemical to pass through a conventionally used membrane filter or a depth filter. The present invention has been completed based on this finding.

(1) A filtration filter according to a first aspect of the present invention is provided with a polyimide resin porous membrane, and is used for filtering a liquid chemical for lithography.

(2) A filtration method according to a second aspect of the present invention includes allowing a liquid chemical for lithography to pass through the filtration filter of the first aspect.

(3) A production method of a purified liquid chemical product for lithography according to a third aspect of the present invention includes filtering a liquid chemical for lithography by the filtration method of the second aspect.

(4) In (3) above, filtering may include an operation of allowing the liquid chemical for lithography to pass through the filter by pressure difference.

(5) In (3) or (4) above, the liquid chemical for lithography may be a resist composition containing a base component (A) which exhibits changed solubility in an alkali developing solution under action of acid and an organic solvent (S), and having an acid generation ability.

(6) In (5) above, the base component (A) may include a polymeric compound (A1) having a structural unit (ap) containing a polar group.

(7) A method of forming a resist pattern according to a fourth aspect of the present invention includes filtering a resist composition containing a base component (A) which exhibits changed solubility in an alkali developing solution under action of acid and an organic solvent (S), and having an acid generation ability by a filter provided with a polyimide resin porous filter to obtain a purified resist composition product; using the purified resist composition product to form a resist film on a substrate; exposing the resist film; and developing the exposed resist film to form a resist pattern.

(8) A filtration filter according to a fifth aspect of the present invention has a porous structure in which adjacent spherical cells are mutually communicating, and is used for filtering a liquid chemical for lithography.

(9) In (8) above, the average diameter of the spherical cells may be from 50 to 2,000 nm.

(10) In (8) or (9) above, the filtration filter may be provided with a thermosetting resin porous membrane.

(11) A filtration method according to a sixth aspect of the present invention includes an operation of allowing a liquid chemical for lithography to pass through the filtration filter of the fifth aspect (any one of (8) to (10) above).

(12) A production method of a purified liquid chemical product for lithography according to a seventh aspect of the present invention includes filtering a liquid chemical for lithography by the filtration method of the sixth aspect ((11) above).

(13) In (12) above, the average diameter of the spherical cells in the filter may be from 50 to 2,000 nm.

(14) In (12) or (13) above, the filter may be provided with a thermosetting resin porous membrane.

(15) In any one of (12) to (14) above, the liquid chemical for lithography may be a resist composition containing a base component (A) which exhibits changed solubility in an alkali developing solution under action of acid and an organic solvent (S), and having an acid generation ability.

(16) In (15) above, the base component (A) may include a polymeric compound (A1) having a structural unit (ap) containing a polar group.

(17) The method of forming a resist pattern according to an eighth aspect of the present invention includes filtering a resist composition containing a base component (A) which exhibits changed solubility in an alkali developing solution under action of acid and an organic solvent (S), and having an acid generation ability by a filter having a porous structure in which adjacent spherical cells are mutually communicating to obtain a purified resist composition product; using the purified resist composition product to form a resist film on a substrate; exposing the resist film; and developing the exposed resist film to form a resist pattern.

According to the filtration filter of the present invention, impurities such as particles mixed with liquid chemicals or the like can be more reliably removed.

According to the filtration method of the present invention, impurities such as particles mixed with liquid chemicals or the like can be more reliably removed.

According to the production method of a purified liquid chemical product for lithography of the present invention, a purified liquid chemical product for lithography can be produced with impurities more reliably reduced. By using a purified resist composition product which is the purified liquid chemical product, generation of defects can be more reliably suppressed in the formation of a resist pattern, and a resist pattern with reduced deficiencies such as generation of scums and microbridges and good shape can be formed.

DETAILED DESCRIPTION OF THE INVENTION

Figure 1:
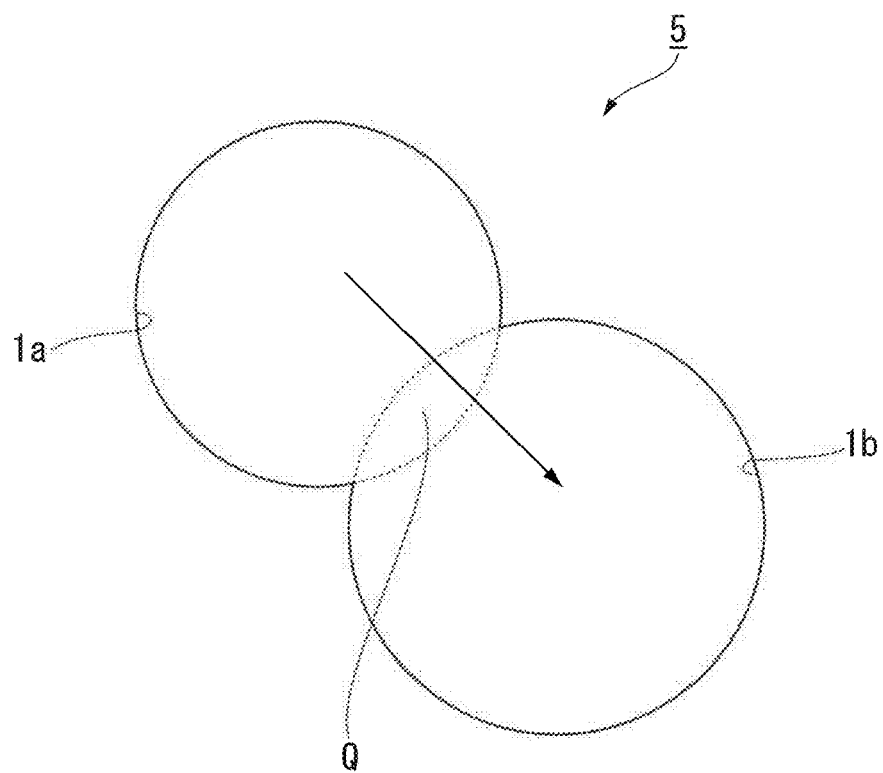
FIG. 1 is a diagram schematically showing one embodiment of communicating pores which constitute a polyimide resin porous membrane.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl, group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

The term "exposure" is used as a general concept that includes irradiation with any form of radiation.

The term "styrene" is a concept including styrene and compounds in which the hydrogen atom at the α-position of styrene is substituted with other substituent such as an alkyl group, a halogenated alkyl group or a hydroxyalkyl group.

The term "styrene derivative" includes compounds in which the hydrogen atom at the α-position of styrene has been substituted with another substituent such as an alkyl group or a halogenated alkyl group; and derivatives thereof. Examples of the derivatives thereof include hydroxystyrene which has a substituent other than a hydroxy group bonded to the benzene ring and may have the hydrogen atom on the α-position substituted with a substituent.

Here, the α-position (carbon atom on the α-position) refers to the carbon atom having the benzene ring bonded thereto, unless specified otherwise.

As the alkyl group as a substituent on the α-position, a linear or branched alkyl group is preferable, and specific examples include alkyl groups of from 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

(First Aspect: Filtration Filter)

The filtration filter according to a first aspect of the present invention is provided with a polyimide resin porous membrane, and is a filtrating material preferable for filtering a liquid chemical for lithography.

<Liquid Chemical for Lithography>

The liquid chemical for lithography which is the object of filtering is not particularly limited, and examples thereof include various liquid chemicals used in the production of a semiconductor device or a liquid crystal display device by photolithography, DSA lithography, imprint lithography, or the like, and various liquid chemicals used as raw materials for production of a semiconductor device or a liquid crystal display device.

Examples of the liquid chemicals include chemicals containing water, a polar solvent such as a ketone solvent, an ester solvent, an alcohol solvent, an ether solvent or an amide solvent, a hydrocarbon solvent, and the like. Examples of liquid chemicals for lithography containing a resin include resin solution in which a resin component for resist is dissolved in an organic solvent, a resist composition (described later), an insulation film composition, an anti-reflection film composition, a block copolymer composition applied to directed self assembly (DSA) technique, and imprint resin composition. In addition, examples of liquid chemicals for lithography used in the formation of a pattern include a pre-wetting solvent, a solvent for resist, and a developing solution.

Examples of ketone solvents include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, and propylenecarbonate.

Examples of ester solvents include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of alcohol solvents include monohydric alcohols, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol solvents, such as ethylene glycol, diethylene glycol and triethylene glycol; and glycol ether solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

A nitrile solvent is an organic solvent containing a nitrile group in the structure thereof, such as acetonitrile.

Examples of ether solvents include the aforementioned glycol ether solvents, dioxane, and tetrahydrofuran.

Examples of amide solvents include N-methyl-2-pyrrolidone, N,N-dimethylacetamide, N,N-dimethylformamide, hexamethylphosphoric amide and 1,3-dimethyl-2-imidazolidinone.

Examples of hydrocarbon solvents include aromatic hydrocarbon solvents such as toluene and xylene; and aliphatic hydrocarbon solvents such as pentane, hexane, octane and decane.

As the resin component for resist, the component (A1) described later (polymeric compound having a structural unit (ap) containing a polar group) is preferable.

As the resist composition which is an object of the filtering, a resist composition containing a base component (A) (hereafter, referred to as "component (A)") which exhibits changed solubility in an alkali developing solution under action of acid and an organic solvent (S) (hereafter, referred to as "component (S)"), and having an acid generation ability may be given as an example.

As the resist composition, a resist composition having a function of generating acid upon exposure may be mentioned, and in the resist composition, the component (A) may generate acid upon exposure, or an additive component other than the component (A) may generate acid upon exposure.

Specific examples of the resist composition include a resist composition (1) containing an acid generator component (B) which generates acid upon exposure (hereafter, referred to as "component (B)":

a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid". In the case where the component (A) is a base component which generates acid upon exposure and exhibits changed solubility in a developing solution under action of acid, the component (A1) described later is preferably a polymeric compound which generates acid upon exposure and exhibits changed solubility in a developing solution under action of acid. As the polymeric compound, a resin having a structural unit which generates acid upon exposure can be used. As the structural unit which generates acid upon exposure, a conventional structural unit can be used. Among these examples, as the resist composition, the above (1) is preferable.

Component (A)

In the present invention, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed.

The organic compound used as the base component is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. Hereafter, a "resin" or a "polymeric compound" refers to a polymer having a molecular weight of 1,000 or more.

As the molecular weight of the polymer, the weight average molecular weight in terms of the polystyrene equivalent value determined by gel, permeation chromatography (GPC) is used.

When the resist composition is a "negative resist composition for alkali developing process" that forms a negative-tone resist pattern in an alkali developing process (or a "positive resist composition for solvent developing process" that forms a positive-tone resist pattern in a solvent developing process), as the component (A), abase component (A-2) that is soluble in an alkali developing solution (hereafter, this base component is sometimes referred to as "component (A-2)") is preferably used, and a cross-linking component is further added. In such a resist composition, for example, when acid is generated from the component (B) upon exposure, the action of the acid causes cross-linking between the component (A-2) and the cross-linking component. As a result, the solubility of the resist composition in an alkali developing solution is decreased (the solubility of the resist composition in an organic developing solution is increased). Therefore, in the formation of a resist pattern, by conducting selective exposure of a resist film formed by applying the resist composition to a substrate, the exposed portions become insoluble in an alkali developing solution (soluble in an organic developing solution), whereas the unexposed portions remain soluble in an alkali developing solution (insoluble in an organic developing solution), and hence, a negative resist pattern is formed by conducting development using an alkali developing solution. Alternatively, in such a case, by developing using an organic developing solution, a positive resist pattern is formed.

As the component (A-2), a resin that is soluble in an alkali developing solution (hereafter, referred to as "alkali-soluble resin") is preferably used.

As the cross-linking agent, typically, an amino-based cross-linking agent such as a glycoluril having a methylol group or alkoxymethyl group, or a melamine-based cross-linking agent is preferable, as it enables formation of a resist pattern with minimal swelling. The amount of the cross-linker added is preferably within, a range from 1 to 50 parts by weight, relative to 100 parts by weight of the alkali-soluble resin.

In the case where the resist composition is a resist composition which forms a positive pattern in an alkali developing process (i.e., a positive resist compound for alkali developing process) or a resist composition which forms a negative pattern in a solvent developing process (i.e., a negative type resist composition for solvent developing process), as a component (A), it is preferable to use a base component (A-1) (hereafter, referred to as "component (A-1)") which exhibits increased polarity by the action of acid. By using the component (A-1), since the polarity of the base component changes prior to and after exposure, an excellent development contrast can be obtained not only in an alkali developing process, but also in a solvent developing process.

More specifically, in the case of applying an alkali developing process, the component (A-1) is substantially insoluble in an alkali developing solution prior to exposure, but when acid is generated from the component (B) upon exposure, the action of this acid causes an increase in the polarity of the base component, thereby increasing the solubility of the component (A-1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern is formed by alkali developing.

On the other hand, in the case of a solvent developing process, the component (A-1) exhibits high solubility in an organic developing solution prior to exposure, and when acid is generated upon exposure, the polarity of the component (A-1) is increased by the action of the generated acid, thereby decreasing the solubility of the component (A-1) in an organic developing solution. Therefore, in the formation of a resist pattern, by conducting selective exposure of a resist film formed by applying the resist composition to a substrate, the exposed portions changes from an soluble state to an insoluble state in an, organic developing solution, whereas the unexposed portions remain soluble in an organic developing solution. As a result, by conducting development using an organic developing solution, a contrast can be made between the exposed portions and unexposed portions, thereby forming a negative resist pattern.

In the present embodiment, as the component (A) used in the resist composition, a resin component having a structural unit (a1) containing an acid decomposable group that exhibits increased polarity by the action of acid, a structural unit (a2) containing a lactone-containing cyclic group, a structural unit (a3) containing a polar group-containing aliphatic hydrocarbon group, a structural unit (a4) containing an acid non-dissociable cyclic group, and/or a structural unit (a5) containing a carbonate-containing cyclic group or an —$SO_2$— containing cyclic group is preferable.

Structural Unit (a1)

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" includes:

(i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A) is increased. By the increase in the polarity, the solubility in an alkali developing solution changes, and the solubility in an alkali developing solution is relatively increased, whereas the solubility in an organic developing solution is relatively decreased.

The acid dissociable group is not particularly limited, and any of the groups that have been conventionally proposed as acid dissociable groups for the base resins of chemically amplified resists can be used.

As the structural unit (a1) contained in the component (A), 1 kind of structural unit may be used, or 2 or more kinds of structural units may be used.

In the component (A), the amount of the structural unit (a1) based on the combined total of all structural units constituting the component (A) is preferably 20 to 80 mol %, more preferably 20 to 75 mol %, and still more preferably 25 to 70 mol %.

Structural Unit (a2)

The structural unit (a2) is a structural unit containing a lactone-containing cyclic group (provided that the structural units that fall under the definition of structural unit (a1) are excluded).

When the component (A) is used for forming a resist film, the lactone-containing cyclic group within the structural unit (a2) is effective in improving the adhesion between the resist film and the substrate.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the structural unit (a2) contained in the component (A), 1 kind of structural unit may be used, or 2 or more kinds of structural units may be used.

In the component (A), the amount of the structural unit (a2) based on the combined total of all structural units constituting the component (A) is preferably 1 to 80 mol %, more preferably 5 to 70 mol %, still more preferably 10 to 65 mol %, and most preferably 10 to 60 mol %.

Structural Unit (a3)

The structural unit (a3) is a structural unit containing a polar group-containing aliphatic hydrocarbon group (provided that the structural units that fall under the definition of structural units (a1) and (a2) are excluded).

When the component (A) includes the structural unit (a3), the hydrophilicity of the component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

As the structural unit (a3) contained in the component (A), 1 kind of structural unit may be used, or 2 or more kinds of structural units may be used.

In the component (A), the amount of the structural unit (a3) based on the combined total of all structural units constituting the component (A) is preferably 5 to 50 mol %, more preferably 5 to 40 mol %, and still more preferably 5 to 25 mol %.

Structural Unit (a4)

The structural unit (a4) is a structural unit containing an acid non-dissociable cyclic group.

When the component (A) includes the structural unit (a4), dry etching resistance of the resist pattern to be formed is improved.

An "acid non-dissociable, aliphatic cyclic group" in the structural unit (a4) refers to a cyclic group which is not dissociated by the action of acid generated from the component (B) described later upon exposure, and remains in the structural unit.

In the component (A), the amount of the structural unit (a4) based on the combined total of all structural units constituting the component (A) is preferably 1 to 30 mol %, and more preferably 10 to 20 mol %.

Structural Unit (a5)

The structural unit (a5) is a structural unit containing an —$SO_2$— containing cyclic group or a carbonate-containing cyclic group.

An "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable.

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

As the structural unit (a5) contained in the component (A), 1 kind of structural unit may be used, or 2 or more kinds of structural units may be used.

In the component (A), the amount of the structural unit (a5) based on the combined total of all structural units constituting the component (A) is preferably 1 to 80 mol %, more preferably 5 to 70 mol %, still more preferably 10 to 65 mol %, and most preferably 10 to 60 mol %.

In the resist composition of the present embodiment, the component (A) preferably contains a polymeric compound (A1) (hereafter, sometimes referred to as "component (A1)") having a structural unit (ap) containing a polar group. In such a case, the effects of the present invention are significant.

Examples of the polar group in the structural unit (ap) include a hydroxy group, a cyano group, a carboxy group, a sulfo group, a hydroxyalkyl group in which part of the hydrogen atoms of the alkyl group has been substituted with fluorine, a carbonyl group (—C(=O)—), a carbonyloxy group (—C(=O)—O—), a carbonate group (—O—C(=O)—O—), a sulfonyl group (—S(=O)$_2$—), and a sulfonyloxy group (—S(=O)$_2$—O—).

Preferable example of the component (A1) include a polymeric compound having a structural unit (a1). Specific examples of the component (A1) include a polymeric compound having a structural unit (a1) and a structural unit (a2), a polymeric compound having a structural unit (a1) and a structural unit (a3), a polymeric compound having a structural unit (a1) and a structural unit (a5), a polymeric compound having a structural unit (a1), a structural unit (a2) and a structural unit (a3), and a polymeric compound having a structural unit (a1), a structural unit (a3) and a structural unit (a5).

The weight average molecular weight (Mw) (the polystyrene equivalent value determined by gel permeation chromatography) of the component (A) is not particularly limited, but is preferably 1,000 to 50,000, more preferably 1,500 to 30,000, and most preferably 2,000 to 20,000.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

Component (S)

The resist composition of the present embodiment may be prepared by dissolving resist materials in an organic solvent (component (S)).

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

As the component (S), 1 kind of solvent may be used, or 2 or more solvents may be used as a mixed solvent.

For example, a mixed solvent in which PGMEA and a polar solvent is mixed may be mentioned.

The amount of the component (S) is not particularly limited, and is appropriately adjusted to a concentration which enables coating of a coating solution to a substrate. In general, the component (S) is used in an, amount such that the solid content of the resist composition becomes preferably within the range from 1 to 20% by weight, and more preferably within the range from 2 to 15% by weight.

For Arbitrary Component

The resist composition of the present invention may contain an acid generator component (B) (component (B)) that generates acid upon exposure, acid diffusion control agent (hereinafter, referred to as "component (D)", at least one compound (E) selected from the group consisting of organic carboxylic acid and oxo acid of phosphorus and derivatives thereof (hereinafter, referred to as "component (E)", and a fluorine additive (hereinafter, referred to as "component (F)"), in addition to the component (A) and the component (S).

For Component (B)

The component (B) is an acid generator component which generates acid upon exposure.

The component (B) is not particularly limited, and those that have been conventionally proposed as an acid generator for chemically amplified resists can be used.

Examples of the component (B) include onium salt-based acid generators such as an iodonium salt and a sulfonium salt, oxime sulfonate-based acid generators, diazomethane-based acid generators such as bisalkyl or bisaryl sulfonyl diazomethanes and poly(bissulfonyl)diazomethanes, nitrobenzyl sulfonate-based acid generators, iminosulfonate-based acid generators, and disulfone-based acid generators. Among these, an onium salt-based acid generator is preferably used.

In the resist composition of the present invention, as the component (B), one type may be used, or two or more types of compounds may be used in combination.

When the resist composition contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. If the amount of the component (B) is within the above range, pattern formation is sufficiently performed. In addition, when the respective components of the resist composition are dissolved in an organic solvent, a uniform solution can be easily obtained, and storage stability becomes better.

For Component (D)

The component (D) is an acid diffusion control agent component.

The component (D) acts as a quencher which traps the acid generated from the component (B) or the like by exposure.

The component (D) may be a photodegradable base (D1) (hereinafter, referred to as "component (D1)") which loses acid diffusion controllability due to decomposition by exposure, or a nitrogen-containing organic compound (D2) (hereinafter, referred to as "component (D2)") not corresponding to the component (D1).

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. If the amount is a preferable lower limit value or greater within the above range, particularly good lithography properties or a resist pattern shape is easily obtained. If the amount is a preferable upper limit value or less within the above range, the sensitivity can be well maintained, and the throughput is also excellent.

As the component (D2), an aliphatic amine, particularly a secondary aliphatic amine, or a tertiary aliphatic amine is preferable. The aliphatic amine is an amine having one or more aliphatic groups, and the number of carbons of the aliphatic group is preferably from 1 to 12.

Examples of the aliphatic amine include an amine (alkylamine or alkyl alcohol amine) in which at least one hydrogen atom of ammonia $NH_3$ has been substituted with an alkyl group or a hydroxyalkyl group having 12 or less carbon atoms and a cyclic amine.

The amount of the component (D2) used relative to 100 parts by weight of the component (A) is typically within a range from 0.01 to 5.0 parts by weight. If the amount is within the above range, the resist pattern shape, the post-exposure temporal stability, and the like are improved.

In the resist composition of the present invention, as the component (D), one type may be used, or two or more types of compounds may be used in combination.

When the resist composition contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. If the amount is a preferable lower limit value or greater within the above range, when a resist composition is obtained, the lithography properties such as LWR is further improved. Further, a resist pattern having an excellent shape can be obtained. If the amount is a preferable upper limit value or less within the above range, the sensitivity can be well maintained, and the throughput is also excellent.

For Component (E)

The component (E) is at least one compound selected from the group consisting of organic carboxylic acids, and oxo acids of phosphorus and derivatives thereof. By containing the component (E), deterioration in sensitivity is prevented, and the resist pattern shape, the post-exposure temporal stability, and the like are improved.

In the resist composition of the present invention, as the component (E), one type may be used, or two or more types of compounds may be used in combination.

When the resist composition contains the component (E), the amount of the component (E) relative to 100 parts by weight of the component (A) is typically within a range from 0.01 to 5.0 parts by weight.

For Component (F)

The component (F) is a fluorine additive. By containing the component (F), water repellency is imparted to the resist film.

Examples of the component (F) include fluorine-containing polymeric compounds described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, or Japanese Unexamined Patent Application, First Publication No. 2011-128226.

In the resist composition of the present invention, as the component (F), one type may be used, or two or more types of compounds may be used in combination.

When the resist composition contains the component (F), the amount of the component (F) relative to 100 parts by weight of the component (A) is within a range from 0.5 to 10 parts by weight.

Miscible additives, for example, an additional resin, a dissolution inhibitor, a surfactant, a plasticizer, a stabilizer, a colorant, an antihalation agent, and a dye for improving resist film performance can be suitably further added or contained in the resist composition as desired.

Examples of the insulation film composition which is an object of the filtering include liquid containing a siloxane polymer, an organohydridosiloxane polymer, an organic hydridosilsesquioxane polymer, or a copolymer of hydrogensilsesquioxane and alkoxyalkyl hydridosiloxane or hydroxyhydridosiloxane, and an organic solvent component.

In addition, examples of the insulation film composition include liquid containing a silsesquioxane resin, an acid generator component which generates acid upon exposure, a cross-linking component, and an organic solvent component.

As the anti-reflection film composition which is an object of the filtering, a composition containing the film constituent material of an anti-reflection film and an organic solvent component is used. The film constituent material may be an organic material, or may be an inorganic material including a Si atom, and mainly, a binder component such as a resin and/or a cross-linker, an absorbing component which absorbs a specific wavelength of ultraviolet rays or the like, and the like can be given. Each of these components may be used alone as a film constituent material, or two or more types (i.e., a resin and a cross-linker, a cross-linker and a light absorbing component, a resin and light absorbing component, and a resin, a cross-linker, and a light absorbing component) may be used as a film constituent material in combination. In addition, a surfactant, an acid compound, an acid generator, a cross-linking promoter, a rheology modifier, an adhesion aid, or the like may be added to the anti-reflection film composition, if necessary.

In addition, examples of the anti-reflection film composition which is an object of the filtering include a liquid containing a polyfunctional epoxy compound which has a plurality of epoxy moieties on the side chains of the core unit and to which one or more cross-linkable chromophores are bonded, a vinyl ether cross-linker, and an organic solvent component.

The "epoxy moieties" refers to at least one of the closed epoxide ring and the ring-opened (reacted) epoxy group of a reacted or unreacted glycidyl group or a glycidyl ether group.

The "cross-linkable chromophores" refers to light attenuating moieties having a cross-linkable group in a free state (i.e. unreacted) after the chromophore are bonded to the polyfunctional epoxy compound.

Examples of the monomer which derives a core unit include those including polyfunctional glycidyls such as tris(2,3-epoxypropyl)isocyanurate, tris(4-hydroxyphenyl) methane triglycidyl ether, trimethylolpropane triglycidyl ether, poly(ethyleneglycol)diglycidyl ether, bis[4-(glycidyloxy)phenyl]methane, bisphenol A diglycidyl ether, 1,4-butanediol diglycidyl ether, resorcinol diglycidyl ether, 4-hydroxybenzoic acid diglycidyl ether, glycerol diglycidyl ether, 4,4'-methylenebis(N,N-diglycidylaniline), monoaryl diglycidyl isocyanurate, tetrakis(oxiranylmethyl)benzene-1,2,4,5-tetracarboxylate, bis(2,3-epoxypropyl)terephthalate, and tris(oxiranylmethyl)benzene-1,2,4-tricarboxylate; 1,3-bis(2,4-bis(glycidyloxy)phenyl)adamantane, 1,3-bis(1-adamantyl)-4,6-bis(glycidyloxy)benzene, 1-(2',4'-bis(glycidyloxy)phenyl)adamantane, and 1,3-bis(4'-glycidyloxyphenyl)adamantane; and polymers such as poly[(phenylglycidylether)-co-formaldehyde], poly[(o-cresylglycidylether)-co-formaldehyde], poly(glycidylmethacrylate), poly(bisphenol A-co-epichlorohydrin)-glycidyl endcap, poly(styrene-co-glycidylmethacrylate), and poly(tert-butylmethacrylate-co-glycidylmethacrylate).

Examples of the precursor (compound before bonding) of the chromophore include 1-hydroxy-2-naphthoic acid, 2-hydroxy-1-naphthoic acid, 6-hydroxy-2-naphthoic acid, 3-hydroxy-2-naphthoic acid, 1,4-dihydroxy-2-naphthoic acid, 3,5-dihydroxy-2-naphthoic acid, 3,7-dihydroxy-2-naphthoic acid, 1,1'-methylene-bis(2-hydroxy-3-naphthoic acid), 2,3-dihydroxybenzoic acid, 2,4-dihydroxybenzoic acid, 2,6-dihydroxybenzoic acid, 3,4-dihydroxybenzoic acid, 3,5-dihydroxybenzoic acid, 3,5-dihydroxy-4-methylbenzoic acid, 3-hydroxy-2-anthracenecarboxylic acid, 1-hydroxy-2-anthracenecarboxylic acid, 3-hydroxy-4-methoxymandelic acid, gallic acid, and 4-hydroxybenzoic acid.

Examples of the block copolymer composition applied to DSA technique which is an object of the filtering include liquid containing a block copolymer and an organic solvent component.

As the block copolymer, for example, a polymeric compound in which a hydrophobic polymer block (b11) and a hydrophilic polymer block (b21) are bonded can be suitably used.

The hydrophobic polymer block (b11) (hereafter, referred to simply as "block (b11)") refers to a block in which, when a plurality of monomers having different affinity relative to water are used, a monomer which exhibits relatively low affinity for water among the plurality of monomers is polymerized to form a polymer (hydrophobic polymer) as the block. The hydrophilic polymer block (b21) (hereafter, referred to simply as "block (b21)") refers to a block in which a monomer which exhibits relatively high affinity for water among the plurality of monomers is polymerized to form a polymer (hydrophilic polymer) as the block.

The block (b11) and the block (b21) are not particularly limited as long as long as they are combinations capable of causing phase separation. However, it is preferable to use a combination of blocks which are mutually incompatible.

Further, as the block (b11) and the block (b21), it is preferable to use a combination in which a phase of at least one block amongst the plurality of blocks constituting the block copolymer can be reliably removed as compared to the phases of other blocks.

As the blocks constituting the block copolymer, 2 kinds of blocks may be used, or 3 or more kinds of blocks may be used.

A partial constitutional component (block) other than the block (b11) and the block (b21) may be bonded to the block copolymer.

Examples of the block (b11) and the block (b21) include a block in which structural units derived from styrene or a styrene derivative are repeatedly bonded; a block in which structural units derived from an acrylate ester which may have the hydrogen atom bonded to the carbon atom on the α-position substituted with a substituent (structural units derived from (α-substituted) acrylate ester) are repeatedly bonded; a block in which structural units derived from acrylic acid which may have the hydrogen atom bonded to the carbon atom on the α-position substituted with a substituent (structural units derived from (α-substituted) acrylic acid) are repeatedly bonded; a block in which structural units derived from siloxane or a derivative thereof are repeatedly bonded; a block in which structural units derived from an alkyleneoxide are repeatedly bonded; and a block in which silsesquioxane structure-containing structural units are repeatedly bonded.

Examples of styrene derivatives include styrene, styrene in which the hydrogen atom on the α-position has been substituted with an alkyl group or a halogenated alkyl group, or derivatives thereof. Examples of such derivatives include styrene in which the hydrogen atom on the α-position may be substituted and has a substituent bonded to the benzene ring. Examples of the substituent include an alkyl group of from 1 to 5 carbon atoms, a halogenated alkyl group of from 1 to 5 carbon atoms and a hydroxyalkyl group.

Specific examples of styrene derivatives thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, and 4-vinylbenzylchloride.

Examples of (α-substituted) acrylate ester include an acrylate ester in which the hydrogen atom bonded to the carbon atom on the α-position is substituted with a substituent. Examples of the substituent include an alkyl group of from 1 to 5 carbon atoms, a halogenated alkyl group of from 1 to 5 carbon atoms and a hydroxyalkyl group.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Examples of (α-substituted) acrylic acid include acrylic acid in which the hydrogen atom bonded to the carbon atom on the α-position is substituted with a substituent. Examples of the substituent include an alkyl group of from 1 to 5 carbon atoms, a halogenated alkyl group of from 1 to 5 carbon atoms and a hydroxyalkyl group. Specific examples of the (α-substituted) acrylic acid include acrylic acid and methacrylic acid.

Examples of siloxane and siloxane derivatives include dimethylsiloxane, diethylsiloxane, diphenylsiloxane, and methylphenylsiloxane.

Examples of the alkylene oxide include ethylene oxide, propylene oxide, isopropylene oxide and butylene oxide.

As the silsesquioxane structure-containing structural unit, polyhedral oligomeric silsesquioxane structure-containing structural unit is preferable. As a monomer which provides a polyhedral oligomeric silsesquioxane structure-containing structural unit, a compound having a polyhedral oligomeric silsesquioxane structure and a polymerizable group can be mentioned.

Examples of the block copolymer include a polymeric compound in which a block in which structural units derived from styrene or a styrene derivative are repeatedly bonded and a block in which structural units derived from an (α-substituted) acrylic acidate are repeatedly bonded are bonded; a polymeric compound in which a block in which structural units derived from styrene or a styrene derivative are repeatedly bonded and a block in which structural units derived from an (α-substituted) acrylic acid are repeatedly bonded are bonded; a polymeric compound in which a block in which structural units derived from styrene or a styrene derivative are repeatedly bonded and a block in which structural units derived from siloxane or a derivative thereof are repeatedly bonded are bonded; a polymeric compound in which a block in which structural units derived from an alkyleneoxide are repeatedly bonded and a block in which structural units derived from an (α-substituted) acrylate are repeatedly bonded are bonded; a polymeric compound in which a block in which structural units derived from an alkyleneoxide are repeatedly bonded and a block in which structural units derived from an (α-substituted) acrylic acid are repeatedly bonded are bonded; a polymeric compound in which a block in which a polyhedral oligomeric silsesquioxane structure-containing structural units are repeatedly bonded and a block in which structural units derived from an (α-substituted) acrylate are repeatedly bonded are bonded; a polymeric compound in which a block in which a polyhedral oligomeric silsesquioxane structure-containing structural units are repeatedly bonded and a block in which structural units derived from an (α-substituted) acrylic acid are repeatedly bonded are bonded; and a polymeric compound in which a block in which a polyhedral oligomeric silsesquioxane structure-containing structural units are repeatedly bonded and a block in which structural units derived from siloxane or a derivative thereof are repeatedly bonded are bonded.

Specific examples of the block copolymer include a polystyrene-polymethyl methacrylate (PS-PMMA) block copolymer, a polystyrene-polymethyl methacrylate block copolymer, a polystyrene-(poly-t-butylmethacrylate) block copolymer, a polystyrene-polymethacrylic acid block copolymer, a polystyrene-polymethyl acrylate block copolymer, a polystyrene-polyethyl acrylate block copolymer, a polystyrene-(poly-t-butylacrylate) block copolymer, and polystyrene-polyacrylic acid block copolymer.

As the organic solvent component used in an insulation film composition, an anti-reflection film composition, or a block copolymer composition, the same components as the component (S) described above can be given.

Examples of the imprint resin composition which is an object of the filtering include a liquid containing a cycloolefin copolymer, a polymerizable monomer, a photoinitiator, and an organic solvent component.

Examples of the organic solvent component include halogenated hydrocarbons such as methyl chloride, dichloromethane, chloroform, ethyl chloride, dichloroethane, n-propyl chloride, n-butyl chloride, and chlorobenzene; alkylbenzenes such as benzene, toluene, xylene, ethylbenzene, propylbenzene, and butylbenzene; linear aliphatic hydrocarbons such as ethane, propane, butane, pentane, hexane, heptane, octane, nonane, and decane; branched aliphatic hydrocarbons such as 2-methylpropane, 2-methylbutane, 2,3,3-trimethylpentane, and 2,2,5-trimethylhexane; cyclic aliphatic hydrocarbons such as cyclohexane, methylcyclohexane, ethylcyclohexane, and decahydroxynaphthalene; and paraffin oil obtained by hydrorefining a petroleum fraction.

Examples of the cycloolefin copolymer include an amorphous polymer having a structural unit including a cyclic olefin structure. Specifically, examples thereof include a copolymer having a structural unit including a cyclic olefin structure and a structural unit including a non-cyclic olefin structure.

Examples of the structural unit including a cyclic olefin structure include a structural unit derived from a diene compound. Examples of the diene compound include cyclodienes such as 2,5-norbornadiene, 5-vinyl-2-norbornene, 5-ethylidene-2-norbornene, 5-methylene-2-norbornene, dicyclopentadiene, 5-isopropylidene-2-norbornene, tricyclopentadiene, 1,4,5,8-dimethano-1,4,4a,5,8,8a-hexahydronaphthalene, cyclopentadiene, 1,4-cyclohexadiene, 1,3-cyclohexadiene, 1,5-cyclooctadiene, 1-vinyl cyclohexene, 2-vinyl cyclohexene, and 3-vinylcyclohexene; and alkyl tetrahydroindenes such as 4,5,7,8-tetrahydroindene, 4-methyl tetrahydroindene, 6-methyl tetrahydroindene, and 6-ethyl tetrahydroindene.

Examples of the structural unit including a non-cyclic olefin structure include acyclic monoolefins, for example, a structural unit derived from α-olefin of from 2 to 20 carbon atoms (preferably, ethylene or propylene); and a structural unit derived from acyclic diene (1,5-hexadiene, 1,4-hexadiene, 1,3-hexadiene, 1,9-decadiene, butadiene, or isoprene).

As the polymerizable monomer, it is possible to use a monofunctional monomer or a polyfunctional monomer, and examples thereof include a monofunctional monomer, a difunctional monomer, a trifunctional monomer, a tetrafunctional monomer, and a pentafunctional monomer, and among these, a difunctional monomer is preferable. The difunctional monomer is preferably a difunctional monomer having an aliphatic cyclic group, and examples thereof include cyclohexanedimethanol diacrylate, cyclohexanedimethanol dimethacrylate, and tricyclodecanedimethanol acrylate.

The photoinitiator may be a compound which initiates or promotes polymerization of a cycloolefin copolymer at the time of light irradiation, and examples thereof include 2-methyl-1-(4-methylthiophenyl)-2-morpholinopropan-1-one, 2,2-dimethoxy-1,2-diphenylethan-1-one, 1-[4-(2-hydroxyethoxy)-phenyl]-2-hydroxy-2-methyl-1-propan-1-one, 1-hydroxy-cyclohexyl-phenyl-ketone, 2-hydroxy-2-methyl-1-phenyl-propan-1-one, iodonium, (4-methylphenyl)[4-(2-methylpropyl)phenyl]-hexalluorophosphate, a mixture of 2-[2-oxo-2-phenylacetoxyethoxy] ethyl ester and 2-(2-hydroxyethoxy)ethyl ester, phenyl glycosylate, and benzophenone.

The filtration filter according to the present aspect is useful in a case where the liquid chemical containing a resin is an object of the filtering. In a case where a liquid chemical for photolithography, a liquid chemical for DSA lithography, or a liquid chemical for imprint lithography among the liquid chemicals containing a resin is an object of the filtering, the filtration filter is more useful, and in a case where a resist composition, a block copolymer composition applied to DSA technique, or an imprint resin composition is an object of the filtering, the filtration filter is particularly useful.

The filtration filter according to the present aspect is particularly useful in a case where the liquid chemical containing the component (A1) among the resist compositions is an object of the filtering.

In addition, among the liquid chemicals for lithography, the filtration filter according to the present aspect is also useful in a case where a liquid chemical selected from the group consisting of a pre-wetting solvent, a solvent for resist, and a developing solution is an object of the filtering.

Furthermore, in the filtration filter according to the present aspect, a filter provided with a polyimide resin porous membrane is used, and the acid resistance is enhanced, and thus, the filtration filter is particularly useful for an object of the filtering (liquid chemical for lithography) exhibiting acidity.

Examples of the developing solution include an alkali developing solution and a developing solution containing an organic solvent (organic developing solution).

As an example of the alkali developing solution, a from 0.1 to 10% by weight aqueous solution of tetramethylammonium hydroxide (TMAH) can be given.

As the organic solvent contained in the organic developing solution, any of the conventional organic solvents can be used which are capable of dissolving the base component (base component prior to exposure). Examples of the organic solvent include polar solvents such as ketone solvents, ester solvents, alcohol solvents, nitrile solvents, amide solvents, and ether solvents, and hydrocarbon solvents, and specific examples thereof include the organic solvents exemplified above.

<Filtration Filter>

The filtration filter according to the present aspect is a filter provided with a polyimide resin porous membrane.

At least a polyimide resin porous membrane is used in the filtration filter, and the filtration filter may be a filter formed of a simple substance of a polyimide resin porous membrane, or may be a filter obtained by using other filtering material together with a polyimide resin porous membrane.

Examples of other filtering material include a nylon membrane, a polytetrafluoroethylene membrane, a tetrafluoroethylene-perfluoroalkyl vinyl ether copolymer (PFA) membrane, and membranes obtained by modifying these.

In the present invention, the "polyimide resin" means any one of polyimide and polyamideimide, or both. The polyimide and the polyamideimide may respectively have at least one functional group selected from the group consisting of a carboxy group, a salt type carboxy group, and an —NH— bond.

In the filtration filter, the region of the polyimide resin porous membrane before and after passing liquid is preferably sealed such that the feed solution of an object of filtering (a liquid chemical for lithography) and filtrate are separated without being present in a mixed state. Examples of this method of sealing include a method of processing by adhesion of the polyimide resin porous membrane by photo (UV) curing, by adhesion (include adhesion by anchoring effect (heat welding or the like)) by heat, or by adhesion using an adhesive, and a method of processing by adhering the polyimide resin porous membrane and another filtering material by a built-in method or the like. As the filtration filter, a filtration filter of which the outer container formed of a thermoplastic resin (polyethylene, polypropylene, PFA, polyether sulfone (PES), polyimide, polyamideimide, or the like) is provided with the polyimide resin porous membrane as described above can be given.

In the filtration filter, as the form of the polyimide resin porous membrane, a planar shape or a pipe shape in which the sides facing the polyimide resin porous membrane are matched can be given. The surface of the pipe shape polyimide resin porous membrane preferably is pleated from the viewpoint of the fact that the area in contact with the feed solution is increased.

For Polyimide Resin Porous Membrane

As the polyimide resin porous membrane which the filtration filter has, a polyimide resin porous membrane having communicating pores can be given.

The communicating pores are communicating pores which are formed by respective pores (cells) imparting porosity to the polyimide resin porous membrane, and the respective pores are preferably pores having a curved surface in the inner surface, and more preferably substantially spherical pores (spherical cells).

In the polyimide resin porous membrane, for example, at least a part of the communicating pores is formed of adjacent pores.

FIG. 1 is a diagram schematically showing one embodiment of communicating pores which constitute a polyimide resin porous membrane.

In the polyimide resin porous membrane of the present embodiment, substantially the entire inner surface of each of a spherical cell 1*a* and a spherical cell 1*b* is a curved surface, and a substantially spherical shape space is formed.

The spherical cell 1*a* and the spherical cell 1*b* are adjacent, and a communicating pores 5 through which the overlapping portion Q between the adjacent spherical cell 1*a* and spherical cell 1*b* penetrates are formed. The object of filtering, for example, flows through the inside of the communicating pore 5 in the direction (direction indicated by an arrow) of the spherical cell 1*b* from the spherical cell 1*a*.

Such communicating pores have a structure in which the adjacent pores are mutually communicating, and in the polyimide resin porous membrane, it is preferable that such a plurality of pores are connected, and a flow path of an object of filtering is formed as a whole.

The "flow path" is typically formed by respective "pores" and/or "communicating pores" being mutually communicating. The respective pores, for example, are formed by the respective fine particles present in a polyimide resin-fine particle composite membrane being removed in the following step, in the production method of the polyimide resin porous membrane described below. In addition, the communicating pores are adjacent pores formed by the fine particles being removed in the following step at the portion where the respective fine particles present in a polyimide resin-fine particle composite membrane are in contact with each other, in the production method of the polyimide resin porous membrane described below.

Figure 2:
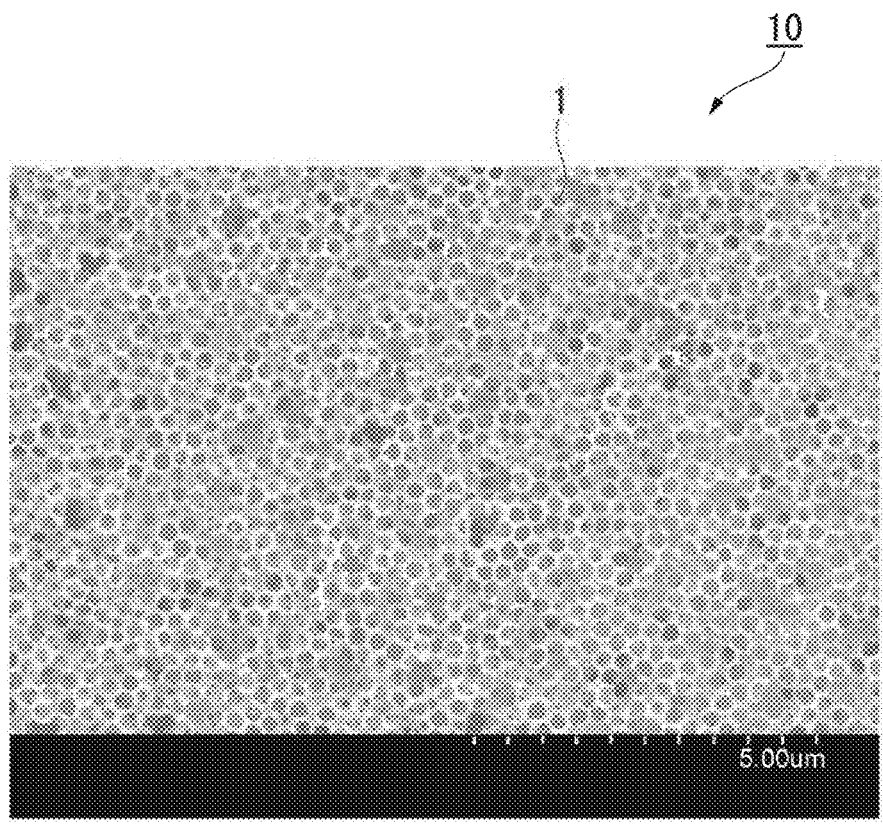
FIG. 2 is a SEM image of the surface of the polyimide resin porous membrane according to the present embodiment by a scanning electron microscope.

FIG. 2 is a SEM image of the surface of the polyimide resin porous membrane according to the present embodiment by a scanning electron microscope (accelerating voltage of 5.0 kV, product name: S-9380, manufactured by Hitachi High-Technologies Corporation).

A polyimide resin porous membrane 10 of the present embodiment has a porous structure in which adjacent spherical cells 1 are mutually communicating.

In the polyimide resin porous membrane 10, the spherical cells 1 and the communicating pores through which the adjacent spherical cells 1 are mutually communicating are formed, and the extent of porosity becomes high. In addition, in the polyimide resin porous membrane 10, the spherical cells 1 or the communicating pores are open on the polyimide resin porous membrane 10 surface, the communicating pores open on the surface of one side are open on the surface of the other side (back side) by communicating the inside of the polyimide resin porous membrane 10, and a flow path through which a fluid can pass the inside of the polyimide resin porous membrane 10 is formed. According to the polyimide resin porous membrane 10, an object of filtering (resist composition) flows through the flow path, and by separation and/or adsorption, foreign matters included in the object of filtering (resist composition) is removed from the object of filtering before filtration.

The polyimide resin porous membrane is a membrane containing a resin, and may be formed of substantially a resin alone, and the resin is preferably 95% by weight or greater, more preferably 98% by weight or greater, and still more preferably 99 by weight or greater, of the entire porous membrane.

In the polyimide resin porous membrane, at least one of polyimide or polyamideimide is included as a resin, at least polyimide is preferably included, and polyimide alone or polyamideimide alone may be included as a resin.

The polyimide resin may have at least one functional group selected from the group consisting of a carboxy group, a salt type carboxy group, and an —NH— bond.

The polyimide resin preferably has the functional group at a site other than the main chain terminal. As a preferable substance having the functional group at a site other than the main chain terminal, for example, polyamic acid can be given.

In the present specification, the "salt type carboxy group" means a group in which the hydrogen atom in the carboxy group has been substituted with a cationic component. The "cationic component" may be a cation itself in a completely ionized state, may be a cationic constituent element in a state where there is no charge virtually by ionic bonding with —COO$^-$, or may be a cationic constituent element having a partial charge in a intermediate state of both states.

In a case where the "cationic component" is an M ion component formed of an n-valent metal M, the cation itself is represented as M$^{n+}$, and the cationic constituent element is an element represented by "M$_{1/n}$" in "—COOM$_{1/n}$".

As the "cationic component", cations in a case where a compound given as a compound contained in an etching liquid described below, is ion-dissociated can be given. Representatively, an ion component or an organic alkali ion component can be given. For example, in a case where an alkali metal ion, component is a sodium ion component, the cation itself is a sodium ion (Na$^+$), and the cationic constituent element is an element represented by "Na" in "—COONa". The cationic constituent element having a partial charge is a Na$^{\delta+}$.

The cationic component is not particularly limited, and inorganic components; and organic components such as NH$_4^+$ and N(CH$_3$)$_4^+$. Examples of the inorganic component include metal elements such as alkali metals including Li, Na, and K; and alkali earth metals such including Mg and Ca. Examples of the organic component include an organic alkali ion component. Examples of the organic alkali ion component include NH$_4^+$, for example, quaternary ammonium cations represented by NR$_4^+$ (all of four R's represent organic groups, and may be the same as or different from each other). The organic group represented by R is preferably an alkyl group, and more preferably an alkyl group of from 1 to 6 carbon atoms. Examples of the quaternary ammonium cation include N(CH$_3$)$_4^+$.

The state of the cationic component in a salt type carboxy group is not particularly limited, and typically, the state depends on the environment in which the polyimide resin is present, for example, environments such as an environment in which the polyimide resin is in an aqueous solution, an environment in which the polyimide resin is in an organic solvent, and an environment in which the polyimide resin is dry. In a case where the cationic component is a sodium ion component, for example, if the component is in an aqueous solution, there is a possibility that —COONa is dissociated into —COO$^-$ and Na$^+$, and if the component is in an organic solvent or dry, a possibility that —COONa is not dissociated is high.

The polyimide resin may have at least one functional group selected from the group consisting of a carboxy group, a salt type carboxy group, and an —NH— bond, but in the case of having at least one among these, typically, the polyimide resin has both a carboxy group and/or a salt type carboxy group and an —NH— bond. The polyimide resin may have only a carboxy group, may have only a salt type carboxy group, or may have both a carboxy group and a salt type carboxy group, in terms of a carboxy group and/or a salt type carboxy group. The ratio between the carboxy group and the salt type carboxy group of the polyimide resin can be varied depending on, for example, the environment in which the polyimide resin is present, and is affected by the concentration of the cationic component, even in the case of the same polyimide resin.

The total number of moles of the carboxy group and the salt type carboxy group of the polyimide resin is typically the same number of moles as that of the —NH— bond in the case of polyimide.

In particular, in the production method of a polyimide porous membrane described below, in a case where a carboxy group and/or a salt type carboxy group is formed from some imide bonds in the polyimide, an —NH— bond is formed substantially at the same time. The total number of moles of the carboxy group and the salt type carboxy group to be formed is equimolar to the —NH— bond to be formed.

In the case of the production method of the polyamideimide porous membrane, the total number of moles of the carboxy group and the salt type carboxy group in polyamideimide is not necessarily equimolar to an —NH— bond, and depends on the conditions of chemical etching in the etching (ring-opening of an imide bond) step described below.

The polyimide resin preferably has at least one structural unit selected from the group consisting of structural units represented by each of the following General Formulas (1) to (4).

In the case of polyimide, the polyimide preferably has at least one structural unit selected from the group consisting of a structural unit represented by the following General Formula (1) and a structural unit represented by the following General Formula (2).

In the case of polyamideimide, the polyamideimide preferably has at least one structural unit selected from the group consisting of a structural unit represented by the following General Formula (3) and a structural unit represented by the following General Formula (4).

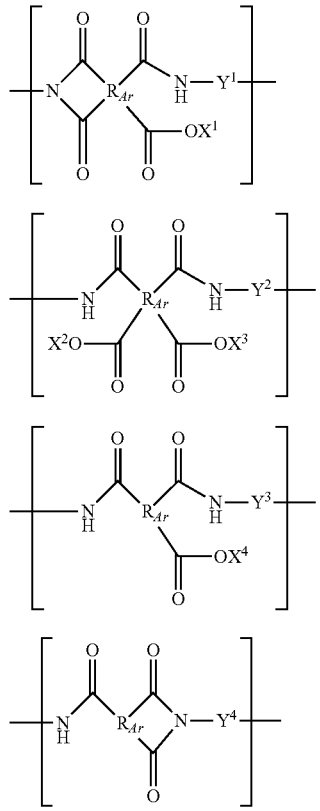

In the above formulas (1) to (3), $X^1$ to $X^4$ the same as or different from each other, and are hydrogen atoms or cationic components.

$R_{Ar}$ is an aryl group, and examples thereof include the same as aryl groups represented by $R_{Ar}$ to which each carbonyl group is bonded in the structural unit represented by Formula (5) constituting polyamic acid described below or the structural unit represented by Formula (6) constituting aromatic polyimide.

$Y^1$ to $Y^4$ each independently represent a divalent residue obtained by removing the amino groups of the diamine compound, and examples thereof include the same as arylene groups represented by $R'_{Ar}$ to which each N is bonded in the structural unit represented by Formula (5) constituting polyamic acid described below or the structural unit represented by Formula (6) constituting aromatic polyimide.

The polyimide resin in the present invention may be a resin formed by having the structural unit represented by General Formula (1) or General Formula (2) in the case of polyimide and the structural unit represented by General Formula (3) in the case of polyamideimide by ring-opening of some of imide bonds (—N[—C(=O)]$_2$) of general polyimide or polyamideimide.

The polyimide resin porous membrane may contain a polyimide resin having at least one functional group selected from the group consisting of a carboxy group, a salt type carboxy group, and a —NH— bond by ring-opening some of imide bonds.

The unchanged ratio in the case of ring-opening some of imide bonds is determined by the following procedures (1) to (3).

Procedure (1): for a polyimide resin porous membrane (here, in, a case where the varnish for producing the porous membrane includes polyamic acid, in the step of baking the unbaked composite membrane, it is assumed that the imidization reaction is substantially completed) on which an etching (ring-opening of an imide bond) step described below has not been performed, a value (X01) represented by the value obtained by dividing the area of the peak indicating an imide bond measured by a Fourier transform infrared spectroscopy (FT-IR) apparatus by the area of the peak indicating benzene measured by the same FT-IR apparatus is determined.

Procedure (2): with respect to the polyimide resin porous membrane obtained by using the same polymer (varnish) as the porous membrane from which the value (X01) has been determined, for the polyimide resin porous membrane after performing the etching (ring-opening of an imide bond) step described below, a value (X02) represented by the value obtained by dividing the area of the peak indicating an imide bond measured by a Fourier transform infrared spectroscopy (FT-IR) apparatus by the area of the peak indicating benzene measured by the same FT-IR apparatus is determined.

Procedure (3): the unchanged ratio is calculated by the following equation.

Unchanged ratio (%)=(X02)÷(X01)×100

The unchanged ratio of the polyimide resin porous membrane is preferably 60% or greater, more preferably from 70% to 99.5%, and still more preferably from 80% to 99%.

In the case of a porous membrane containing polyamideimide, an —NH— bond is included, and thus, the unchanged ratio may be 100%.

In the case of a polyimide porous membrane, the value obtained by dividing the area of the peak indicating an imide bond measured by an FT-IR apparatus by the area of the peak indicating benzene measured by the same FT-IR apparatus is taken as "imidization ratio".

The imidization ratio for the value (X02) determined in the procedure (2) is preferably 1.2 or greater, more preferably from 1.2 to 2, still more preferably from 1.3 to 1.6, particularly preferably from 1.30 to 1.55, and most preferably 1.35 or greater and less than 1.5. In addition, the imidization ratio for the value (X01) determined in the procedure (1) is preferably 1.5 or greater.

As the relative number of the imidization ratio is greater, the number of imide bonds is increased, that is, this indicates that the ring-opened imide bonds described above are small.

Production Method of Polyimide Resin Porous Membrane

The polyimide resin porous membrane can be produced from some of the imide bonds in the polyimide and/or the polyamideimide by a method including a step of forming a carboxy group and/or a salt type carboxy group (hereinafter, referred to as "etching step").

In the etching step, in a case where a carboxy group and/or a salt type carboxy group is formed from some of imide bonds, substantially at the same time, an —NH— bond equimolar to these groups theoretically is also formed.

In a case where a resin containing a polyimide resin porous membrane is formed from substantially polyamideimide, the porous membrane already has an —NH— bond even without performing the etching step, and shows good adsorption ability with respect to foreign matters in an object of filtering. In this case, from the viewpoint of the fact that there is no particular need to make the flow rate of the object of filtering slow, the etching step is not necessarily required, but from the viewpoint of more effectively achieving the object of the present invention, the etching step is preferably provided.

In the production method of the polyimide resin porous membrane, the etching step is preferably performed after a resin molded membrane (hereinafter, referred to as "polyimide resin molded membrane") having polyimide and/or polyamideimide as main components.

The polyimide resin molded membrane which is an object of the etching step may be porous or nonporous.

In addition, the form of the polyimide resin molded membrane is not particularly limited, and from the viewpoint of being capable of increasing the degree of porosity in the obtained polyimide resin porous membrane, the form is preferably a thin shape such as a membrane, and more preferably a porous shape and a thin shape such as a membrane.

As described above, the polyimide resin molded membrane may be nonporous when performing an etching step, and in this case, porosifying is preferably performed after the etching step.

As the method of porosifying a polyimide resin molded membrane before or after the etching step, a method of including the [Removal of fine particles] step of porosifying by removing the fine particles from the composite membrane of polyimide and/or polyamideimide, and fine particles (hereinafter, referred to as a "polyimide resin-fine particle composite membrane") is preferable.

Examples of the production method of a polyimide resin porous membrane include the following production method (a) or (b).

Production method (a): a method of performing an etching step on the composite membrane of polyimide and/or polyamideimide, and fine particles, before the [Removal of fine particles] step.

Production method (b): a method of performing the etching step on the polyimide resin molded membrane porosified by the etching step after the [Removal of fine particles] step.

Among these, from the viewpoint of being capable of increasing the degree of porosity in the obtained polyimide resin porous membrane, the production method (b) is preferable.

An example of the production method of a polyimide resin porous membrane will be described below.

[Preparation of Varnish]

By mixing a fine particle dispersion obtained by dispersing fine particle in an organic solvent in advance and polyamic acid, polyimide, or polyamideimide in an arbitrary ratio, by obtaining polyamic acid by polymerizing tetracarboxylic dianhydride and diamine in the fine particle dispersion, or by obtaining polyimide by further imidizing the polyamic acid, a varnish is prepared.

The viscosity of the varnish is preferably from 300 to 2000 cP (from 0.3 to 2 Pa·s), and more preferably from 400 to 1800 cP (from 0.4 to 1.8 Pa·s). If the viscosity of the varnish is within the above range, it is possible to more uniformly form a film.

The viscosity of the varnish can be measured under a temperature condition of 25° C. using an E type rotational viscometer.

When a polyimide resin-fine particle composite membrane is obtained by baking (drying in a case where the components are arbitrary), the resin fine particles and polyamic acid, polyimide, or polyamideimide are mixed in the above-described varnish such that the ratio of the fine particles/polyimide resin preferably becomes from 1 to 4 (weight ratio), and more preferably becomes from 1.1 to 3.5 (weight ratio).

In addition, when a polyimide resin-fine particle composite membrane is obtained, the fine particles and polyamic acid, polyimide, or polyamideimide are mixed in the above-described varnish such that the volume ratio of the fine particles/polyimide resin, preferably becomes from 1.1 to 5, and more preferably becomes from 1.1 to 4.5.

If the weight ratio or the volume ratio is a preferable lower limit value or greater within the above range, it is possible to easily obtain pores having a proper density as a porous membrane, and if the weight ratio or the volume ratio is a preferable upper limit value or less within the above range, problems such as increase in viscosity and cracks hardly occur, and thus, it is possible to form a film.

In the present specification, the volume ratio indicates a value at 25° C.

Fine Particles

The material of the fine particles can be used without particular limitation as long as the material is insoluble in organic solvents used for varnishes, and can be selectively removed after film formation.

Examples of the inorganic material of the fine particles include metal oxides such as silica (silicon dioxide), titanium oxide, alumina ($Al_2O_3$), and calcium carbonate. Examples of the organic material include organic polymers such as high molecular weight olefins (polypropylene, polyethylene, and the like), polystyrene, acrylic resins (methyl methacrylate, isobutyl methacrylate, polymethyl methacrylate (PMMA), and the like), epoxy resins, cellulose, polyvinyl alcohol, polyvinyl butyral, polyesters, polyethers, and polyethylene.

Among these, from the viewpoint of the fact that fine pores having a curved surface in the inner surface of a porous membrane are easily formed, as the inorganic material, silica such as colloidal silica is preferable. As the organic material, acrylic resins such as PMMA are preferable.

The resin fine particles, for example, can be selected from typical linear polymers or known depolymerizable polymers without particular limitation according to the purpose. The typical linear polymer is a polymer of which the molecular chain is randomly cleaved at the time of thermal decomposition. The depolymerizable polymer is a polymer which is decomposed into monomers at the time of thermal decomposition. Since any of the polymers is also decomposed into monomers, low molecular weight substances, or $CO_2$ at the time of heating, the polymers can be removed from the polyimide resin membrane.

Among the depolymerizable polymers, any one of methyl methacrylate and isobutyl methacrylate (polymethyl methacrylate or poly isobutyl methacrylate) having a low thermal decomposition temperature or a copolymerization polymer which has polymethyl methacrylate or poly isobutyl methacrylate as a main component is preferable from the viewpoint of ease of handling at the time of pore formation.

The decomposition temperature of the resin fine particles is preferably from 200 to 320° C., and more preferably from 230 to 260° C. If the decomposition temperature is 200° C. or higher, it is possible to from a film even in a case where a high boiling point solvent is used in the varnish, and the range of choice in the baking conditions of the polyimide resin becomes wider. If the decomposition temperature is 320° C. or lower, it is possible to easily eliminate only the resin fine particles without causing thermal damage to the polyimide resin.

The fine particles preferably have a high sphericity from the viewpoint of the fact that the inner surface of the pores in the porous membrane to be formed is likely to have a curved surface. The particle diameter (average diameter) of the fine particles used, for example, is preferably from 50 to 2000 nm, and more preferably from 200 to 1000 nm.

If the average diameter of the fine particles is within the above range, when passing an object of filtering through the polyimide resin porous membrane obtained by removing the fine particles, it is possible to evenly bring the object of filtering into contact with the inner surface of a pore in the porous membrane, and it is possible to efficiently perform adsorption of foreign matters included in the object of filtering.

The particle size distribution index (d25/d75) of the fine particles is preferably from 1 to 6, more preferably from 1.6 to 5, and sill more preferably from 2 to 4.

If the particle size distribution index is a preferable lower limit value or greater within the above range, the fine particles can be efficiently packed in, the inner portion of the porous membrane, and thus, a flow path is easily formed, and the flow rate is improved. In addition, pores having different sizes is easily formed, and the adsorption rate of foreign matters is further improved by occurrence of different convection.

d25 and d75 are values of the particle diameter having a cumulative frequencies of the particle size distribution of 75% and 25%, respectively, and in the present specification, d25 is a larger particle diameter.

In addition, in the [Formation of unbaked composite membrane] described below, in a case where an unbaked composite membrane is formed as a two-layered form, fine particles (B1) used in the first varnish and fine particles (B2) used in the second varnish may be the same as or may be different from each other. To make the pores on the side in contact with the base dense, the fine particles (B1) preferably have a particle size distribution index smaller than that of the fine particles (B2) or the same particle size distribution index. Alternatively, the fine particles (B1) preferably have sphericity smaller than that of the fine particles (B2) or the same sphericity. In addition, the fine particles (B1) preferably have a particle diameter (average diameter) of fine particles smaller than that of the fine particles (B2), and in particular, the fine particles (B1) having from 100 to 1000 nm (more preferably from 100 to 600 nm) and the fine particles (B2) having from 500 to 2000 nm (more preferably from 700 to 2000 nm) are preferably used, respectively. By using particles having a particle diameter smaller than that of the fine particles (B2) as the fine particles (B1), it is possible to increase the opening ratio of the pores on the obtained polyimide resin porous membrane surface and to make the diameter uniform, and it is possible to increase the strength of the porous membrane to be greater than that in a case where the entirety of the polyimide resin porous membrane is formed of the fine particles (B1) alone.

In the present invention, for the purpose of uniformly dispersing fine particles in the varnish, a dispersant may be further added thereto together with the fine particles. By further adding a dispersant, it is possible to more uniformly mix polyamic acid, polyimide, or polyamideimide, and fine particles, and it is possible to uniformly distribute the fine particles in an unbaked composite membrane. As a result, it is possible to provide a dense opening on the surface of the finally obtained polyimide resin porous membrane, and it is possible to efficiently form the communicating pores for communicating the rear surface of the porous membrane such that the air permeability of the polyimide resin porous membrane is improved.

The dispersant is not particularly limited, and a known dispersant can be used. Examples of the dispersant include anionic surfactants such as a coconut fatty acid salt, a castor sulfonated oil salt, a lauryl sulfate, a polyoxyalkylene allylphenyl ether sulfate, an alkylbenzene sulfonic acid, an alkylbenzene sulfonate, an alkyldiphenyl ether disulfonate, an, alkylnaphthalene sulfonate, a dialkyl sulfosuccinate, an isopropyl phosphate, a polyoxyethylene alkyl ether phosphate, and a polyoxyethylene allylphenyl ether phosphate; cationic surfactants such as oleylamine acetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as a coconut alkyldimethylamine oxide, a fatty acid amidopropyldimethylamine oxide, an alkylpolyaminoethylglycine hydrochloride, an amidobetaine type activator, an alanine type activator, and lauryliminodipropionic acid; polyoxyethylene octyl ether, polyoxyethylene decyl ether, polyoxyethylene lauryl ether, polyoxyethylene laurylamine, polyoxyethylene oleylamine, polyoxyethylene polystyryl phenyl ether, polyoxyalkylene polystyrylphenyl ether, other polyoxyalkylene primary alkyl ether or polyoxyalkylene secondary alkyl ether nonionic surfactants, polyoxyethylene dilaurate, polyoxyethylene laurate, polyoxyethylenated castor oil, polyoxyethylenated hydrogenated castor oil, sorbitan laurate, polyoxyethylene sorbitan laurate, fatty acid diethanolamide, other polyoxyalkylene nonionic surfactants; fatty acid alkyl esters such as octyl stearate and trimethylolpropane decanoate; and polyether polyols such as a polyoxyalkylene ether, a polyoxyalkylene oleyl ether, a trimethylolpropane tris(polyoxyalkylene) ether. As the dispersant, one type can be used, or two or more types thereof can be used in combination.

Polyamic Acid

Examples of the polyamic acid which can be used in the present invention, include those obtained by polymerizing arbitrary tetracarboxylic dianhydride and diamine.

Tetracarboxylic Dianhydride

The tetracarboxylic dianhydride can be suitably selected from tetracarboxylic dianhydrides which are used as synthetic raw materials for polyamic acid in the related art.

The tetracarboxylic dianhydride may be an aromatic tetracarboxylic dianhydride, or may be an aliphatic tetracarboxylic dianhydride.

Examples of the aromatic tetracarboxylic dianhydride include pyromellitic dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 3,3',4,4'-biphenyltetracarboxylic dianhydride, 2,3,3',4'-biphenyltetracarboxylic dianhydride, 2,2,6,6-biphenyltetracarboxylic dianhydride, 2,2-bis(3,4-dicarboxyphenyl)propane dianhydride, 2,2-bis(2,3-dicarboxyphenyl)propane dianhydride, 2,2-bis(3,4-carboxyphenyl)-1,1,1,3,3,3-hexafluoropropane dianhydride, 2,2-bis(2,3-dicarboxyphenyl)-1,1,1,3,3,3-hexafluoropropane dianhydride, 3,3',4,4'-benzophenonetetracarboxylic dianhydride, bis(3,4-dicarboxyphenyl)ether dianhydride, bis(2,3-dicarboxyphenyl)ether dianhydride, 2,2',3,3'-benzophenonetetracarboxylic dianhydride, 4,4-(p-phenyleneoxy)diphthalic dianhydride, 4,4-(m-phenylenedioxy)diphthalic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,3,4-benzenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, 9,9-bisphthalic anhydride fluorene, and 3,3',4,4'-diphenylsulfonetetracarboxylic dianhydride.

Examples of the aliphatic tetracarboxylic dianhydride include ethylenetetracarboxylic dianhydride, butanetetracarboxylic dianhydride, cyclopentanetetracarboxylic dianhydride, cyclohexanetetracarboxylic dianhydride, 1,2,4,5-cyclohexanetetracarboxylic dianhydride, and 1,2,3,4-cyclohexanetetracarboxylic acid dianhydride.

Among these, from the viewpoint of heat resistance of the polyimide resin to be obtained, an aromatic tetracarboxylic dianhydride is preferable. Among these, from the viewpoint of price and availability, 3,3',4,4'-biphenyltetracarboxylic dianhydride or pyromellitic dianhydride is preferable.

As the tetracarboxylic dianhydride, one type can be used, or two or more types thereof can be used in combination.

Diamine

The diamine can be suitably selected from diamines which are used as synthetic raw materials for polyamic acid in the related art. The diamine may be an aromatic diamine, or, may be an aliphatic diamine, but from the viewpoint of heat resistance of the polyimide resin to be obtained, an aromatic diamine is preferable. As the diamine, one type can be used, or two or more types thereof can be used in combination.

Examples of the aromatic diamine include a diamino compound in which about one or from 2 to 10 phenyl groups are bonded. Specific examples of the aromatic diamine include phenylenediamine or derivatives thereof, a diaminobiphenyl compound or derivatives thereof, a diaminodiphenyl compound or derivatives thereof, a diaminotriphenyl compound or derivatives thereof, diaminonaphthalene or derivatives thereof, aminophenylaminoindane or derivatives thereof, diaminotetraphenyl compound or derivatives thereof, a diaminohexaphenyl compound or derivatives thereof, and cardo type fluorenediamine derivatives.

As the phenylenediamine, m-phenylenediamine or p-phenylenediamine is preferable. As the phenylenediamine derivatives, diamines in which an alkyl group such as a methyl group or an ethyl group is bonded, for example, 2,4-diaminotoluene and 2,4-triphenylenediamine, can be given.

The diaminobiphenyl compound is a compound in which the phenyl groups in two aminophenyl groups are bonded with each other. Examples of the diaminobiphenyl compound include 4,4'-diaminobiphenyl, 4,4'-diamino-2,2'-bis(trifluoromethyl)biphenyl.

The diaminobiphenyl compound is a compound in which the phenyl groups in two aminophenyl groups are bonded with each other through other groups. Examples of the other groups include an ether bond, a sulfonyl bond, a thioether bond, an alkylene group or a derivative group thereof, an imino bond, an azo bond, a phosphineoxide bond, an amide bond, and a ureylene bond. The alkylene group preferably has about from 1 to 6 carbon atoms, and the derivative group thereof is a group in which one or more hydrogen atoms of the alkylene group are substituted with halogen atoms or the like.

Examples of the diaminodiphenyl compound include 3,3'-diaminodiphenyl ether, 3,4'-diaminodiphenyl ether, 4,4'-diaminodiphenyl ether, 3,3'-diaminodiphenyl sulfone, 3,4'-diaminodiphenyl sulfone, 4,4'-diaminodiphenyl sulfone, 3,3'-diaminodiphenyl methane, 3,4'-diaminodiphenyl methane, 4,4'-diaminodiphenyl methane, 4,4'-diaminodiphenyl sulfide, 3,3'-diaminodiphenyl ketone, 3,4'-diaminodiphenyl ketone, 2,2-bis(p-aminophenyl)propane, 2,2'-bis(p-aminophenyl)hexafluoropropane, 4-methyl-2,4-bis(p-aminophenyl)-1-pentene, 4-methyl-2,4-bis(p-aminophenyl)-2-pentene, iminodianiline, 4-methyl-2,4-bis(p-aminophenyl)pentane, bis(p-aminophenyl)phosphine oxide, 4,4'-aminoazobenzene, 4,4'-diaminodiphenyl urea, 4,4'-diaminodiphenyl amide, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(4-aminophenoxy)phenyl]hexafluoropropane.

The diaminotriphenyl compound is a compound in which two aminophenyl groups and one phenylene group are bonded to with each other through respective other groups. Examples of the other groups include the same groups as the other groups in the diaminodiphenyl compound.

Examples of the diaminotriphenyl compound include 1,3-bis(m-aminophenoxy)benzene, 1,3-bis(p-aminophenoxy)benzene, and 1,4-bis(p-aminophenoxy)benzene.

Examples of the diaminonaphthalene include 1,5-diaminonaphthalene and 2,6-diaminonaphthalene.

Examples of the aminophenylaminoindane include 5 or 6-amino-1-(p-aminophenyl)-1,3,3-trimethylindane.

Examples of the diaminotetraphenyl compound include 4,4'-bis(p-aminophenoxy)biphenyl, 2,2'-bis[p-(p'-aminophenoxy)phenyl]propane, 2,2'-bis[p-(p'-aminophenoxy)biphenyl]propane, and 2,2'-bis[p-(m-aminophenoxy)phenyl]benzophenone.

Examples of the cardo type fluorenediamine derivatives include 9,9-bisanilinefluorene.

The aliphatic diamine preferably has, for example, about from 2 to 15 carbon atoms, and specific examples thereof include pentamethylenediamine, hexamethylenediamine, and heptamethylenediamine.

The diamine may be a compound in which the hydrogen atom has been substituted with at least one substituent selected from the group consisting of a halogen atom, a methyl group, a methoxy group, a cyano group, and a phenyl group.

Among these, as the diamine, phenylenediamine, phenylenediamine derivatives, or a diaminodiphenyl compound is preferable. Among these, from the viewpoint of price and availability, p-phenylenediamine, m-phenylenediamine, 2,4-diaminotoluene, or 4,4'-diaminodiphenyl ether is particularly preferable.

The production method of polyamic acid is not particularly limited, and for example, a known method such as a method of reacting arbitrary tetracarboxylic dianhydride with diamine in an organic solvent is used.

The reaction of tetracarboxylic dianhydride with diamine is typically performed in an organic solvent. The organic solvent used here is not particularly limited as long as it can dissolve tetracarboxylic dianhydride and diamine respectively, and does not react with tetracarboxylic dianhydride and diamine. As the organic solvent, one type can be used, or two or more types thereof can be used in combination.

The organic solvent used for the reaction of tetracarboxylic dianhydride and diamine include nitrogen-containing polar solvents such as N-methyl-2-pyrrolidone, N,N-dimethylacetamide, N,N-diethylacetamide, N,N-dimethylformamide, N,N-diethylformamide, N-methylcaprolactam, and N,N,N',N'-tetramethylurea; lactone-based polar solvents such as β-propiolactone, γ-butyrolactone, γ-valerolactone, δ-valerolactone, γ-caprolactone, and ε-caprolactone; dimethylsulfoxide; acetonitrile; fatty acid esters such as ethyl lactate and butyl lactate; ethers such as diethylene glycol dimethyl ether, diethylene glycol diethyl ether, dioxane, tetrahydrofuran, methyl cellosolve acetate, and ethyl cellosolve acetate; and phenol-based solvents such as cresols.

Among these, as the organic solvent here, a nitrogen-containing polar solvent is preferably used from the viewpoint of solubility of generated polyamic acid.

In addition, from the viewpoint of film formability or the like, a mixed solvent including a lactone-based polar solvent is preferably used. In this case, the amount of lactone-based polar solvent relative to the total weight (100% by weight) of the organic solvent is preferably from 1 to 20% by weight, and more preferably from 5 to 15% by weight.

In the organic solvent here, one or more selected from the group consisting of nitrogen-containing polar solvents and lactone-based polar solvents is preferably used, and a mixed solvent of a nitrogen-containing polar solvent and a lactone-based polar solvent is more preferably used.

The amount of organic solvent used is not particularly limited, and is preferably an amount at which the amount of the generated polyamic acid in the reaction solution after the reaction becomes about from 5 to 50% by weight.

Each amount of tetracarboxylic dianhydride and diamine used is not particularly limited, and from 0.50 to 1.50 moles of diamine relative to 1 mole of tetracarboxylic acid dianhydride is preferably used, from 0.60 to 1.30 moles is more preferably used, and from 0.70 to 1.20 moles is particularly preferably used.

The reaction (polymerization) temperature is generally from −10 to 120° C., and preferably from 5 to 30° C.

The reaction (polymerization) time varies depending on the raw material composition used, but is typically from 3 to 24 (hours).

In addition, the intrinsic viscosity of the polyamic acid solution obtained under these conditions is preferably within a range of from 1000 to 100000 cP (centipoise) (from 1 to 100 Pa·s), and more preferably within a range of from 5000 to 70000 cP (from 5 to 70 Pa·s).

The intrinsic viscosity of the polyamic acid solution can be measured under a temperature condition of 25° C. using an E type rotational viscometer.

Polyimide

The polyimide which can be used in the present invention is not limited to the structure and the molecular weight thereof as long as it can be dissolved in the organic solvent used in a varnish, and a known polyimide can be used.

Polyimide may have a condensable functional group such as a carboxy group on the side chain or a functional group promoting a cross-linking reaction or the like at the time of baking.

To obtain polyimide soluble in the organic solvent used in a varnish, the use of a monomer for introducing a flexible bend structure in the main chain is effective.

Examples of the monomer include aliphatic diamines such as ethylenediamine, hexamethylenediamine, 1,4-diaminocyclohexane, 1,3-diaminocyclohexane, and 4,4'-diaminodicyclohexylmethane; aromatic diamines such as 2-methyl-1,4-phenylenediamine, m-tolidine, 3,3'-dimethoxybenzidine, and 4,4'-diaminobenzanilide; polyoxyalkylenediamines such as polyoxyethylenediamine, polyoxypropylenediamine, and polyoxybutylenediamine; polysiloxanediamine; and 2,3,3',4'-oxydiphthalic anhydride, 3,4,3',4'-oxydiphthalic anhydride, and 2,2-bis(4-hydroxyphenyl)propane dibenzoate-3,3',4,4'-tetracarboxylic dianhydride.

In addition, it is also effective to use a monomer having a functional group which improves the solubility in the organic solvent. Examples of the monomer having such a functional group include fluorinated diamines such as 2,2'-bis(trifluoromethyl)-4,4'-diaminobiphenyl and 2-trifluoromethyl-1,4-phenylenediamine.

Furthermore, in addition to the monomer having such a functional group, the monomers exemplified in the description of the above-described polyamic acid can also be used in combination within a range not impairing the solubility.

The production method of polyimide is not particularly limited, and for example, a known method such as a method of chemically imidizing or thermally imidizing polyamic acid and of dissolving the resulting product in, an organic solvent can, be given.

Examples of the polyimide which can be used in the present invention include aliphatic polyimides (entire aliphatic polyimides) and aromatic polyimides, and among these, aliphatic polyimides are preferable.

The aromatic polyimide may be an aromatic polyimide obtained by thermally or chemically ring-closing reaction of polyamic acid having a structural unit represented by the following General Formula (5) or an aromatic polyimide obtained by dissolving polyimide having a structural unit represented by the following General Formula (6) in a solvent.

In the formula, $R_{Ar}$ represents an aryl group, and $R'_{Ar}$ represents an arylene group.

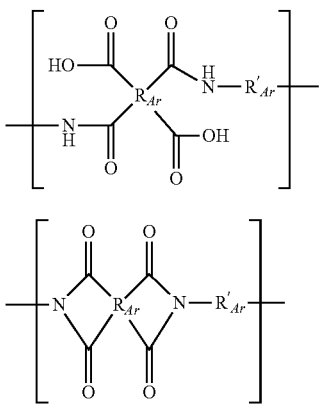

(5)

(6)

In the formula, $R_{Ar}$ is not particularly limited as long as it is a cyclic conjugated system having $4n+2\pi$ electrons, and may be monocyclic or polycyclic. The aromatic ring preferably has from 5 to 30 carbon atoms, more preferably from 5 to 20, still more preferably from 6 to 15, and most preferably from 6 to 12. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring. Among these, an aromatic hydrocarbon ring is preferable, benzene or naphthalene is more preferable, and benzene is particularly preferable.

In the above formulas, examples of $R'_{Ar}$ include a group obtained by removing two hydrogen atoms from the aromatic ring in $R_{Ar}$. Among these, a group obtained by removing two hydrogen atoms from an aromatic hydrocarbon ring is preferable, a group obtained by removing two hydrogen atoms from benzene or naphthalene is more preferable, and a phenylene group obtained by removing two hydrogen atoms from benzene is particularly preferable.

The aryl group represented by $R_{Ar}$ and the arylene group represented by $R'_{Ar}$ may have a substituent, respectively.

Polyamideimide

The polyamideimide which can be used in the present invention is not limited to the structure and the molecular weight thereof as long as it can be dissolved in the organic solvent used in a varnish, and a known polyamideimide can be used.

Polyamideimide may have a condensable functional group such as a carboxy group on the side chain or a functional group promoting a cross-linking reaction or the like at the time of baking.

As the polyamideimide, polyamideimide obtained by a reaction of arbitrary trimellitic anhydride with diisocyanate or polyamideimide obtained by imidizing the precursor polymer obtained by a reaction of a reactive derivative of arbitrary trimellitic anhydride with a diamine can be used without particular limitation.

Examples of the reactive derivative of the arbitrary trimellitic anhydride include trimellitic anhydride halides such as trimellitic anhydride chloride and trimellitic anhydride esters.

Examples of the arbitrary diisocyanates include meta-phenylene diisocyanate, p-phenylene diisocyanate, o-tolidine diisocyanate, p-phenylene diisocyanate, m-phenylene diisocyanate, 4,4'-oxybis(phenylisocyanate), 4,4'-diisocyanatodiphenylmethane, bis[4-(4-isocyanatephenoxy)phenyl] sulfone, 2,2'-bis[4-(4-isocyanatephenoxy)phenyl]propane, 2,4-tolylene diisocyanate, 2,6-tolylene diisocyanate, 4,4'-diphenylmethane diisocyanate, 3,3'-dimethyldiphenyl-4,4'-diisocyanate, 3,3'-diethyldiphenyl-4,4'-diisocyanate, isophorone diisocyanate, hexamethylene diisocyanate, 4,4'-dicyclohexylmethane diisocyanate, m-xylene diisocyanate, p-xylene diisocyanate, and naphthalene diisocyanate.

Examples of the above-described arbitrary diamine include the same diamines as those exemplified in, the description of the above-described polyamic acid.

Organic Solvent

The organic solvent which can be used in the preparation of varnishes is not particularly limited as long as it is possible to dissolve polyamic acid and/or a polyimide resin and does not dissolve the fine particles, and examples thereof include the same organic solvents as those used in the reaction of tetracarboxylic dianhydride and diamine.

As the organic solvent, one type can be used, or two or more types thereof can be used in combination.

The amount of the organic solvent in the varnish is preferably from 50 to 95% by weight, and more preferably from 60 to 85% by weight. The concentration of the solid content in the varnish is preferably from 5 to 50% by weight, and more preferably from 15 to 40% by weight.

In addition, in the [Formation of unbaked composite membrane] described below, in a case where an unbaked composite membrane is formed as a two-layered form, the volume ratio between polyamic acid, polyimide, or the polyamideimide (A1), and the fine particles (B1) in the first varnish is preferably from 19:81 to 45:55. In a case where the total is 100, if the volume proportion of the fine particles (B1) is 55 or greater, the particles are uniformly dispersed, and if the volume proportion is 81 or less, the particles are easily dispersed without agglomeration of the particles. Thus, pores can be uniformly formed on the surface side of the base side of the polyimide resin molded membrane.

In addition, the volume ratio between polyamic acid, polyimide, or a polyamideimide (A2), and the fine particles (B2) in the second varnish is preferably from 20:80 to 50:50.

In a case where the total is 100, if the volume proportion of the fine particles (B2) is 50 or greater, the particle simple substances are likely to be uniformly dispersed, and if the volume proportion is 80 or less, the particles do not agglomerate to each other, and cracks hardly occur on the surface. Thus, a polyimide resin porous membrane having good mechanical characteristics such as stress, breaking elongation, and the like is likely to be formed.

For the volume ratio, the second varnish preferably has a fine particles-containing ratio lower than that of the first varnish. By satisfying the above conditions, even in a case where the fine particles are highly packed in polyamic acid, polyimide, or polyamideimide, the strength and the flexibility of an unbaked composite membrane, a polyimide resin-fine particle composite membrane, and a polyimide resin porous membrane are ensured. In addition, by providing a layer having a low fine particles-containing ratio, the production cost can be reduced.

When preparing a varnish, in addition to the components described above, known components such as an antistatic agent, a flame retardant, a chemically imidizing agent, a condensing agent, a release agent, and a surface conditioner can be mixed in, if necessary, for the purpose of preventing static charge, imparting flame retardancy, low-temperature baking, releasability, coating properties, and the like.

[Formation of Unbaked Composite Membrane]

The formation of an unbaked composite membrane containing polyamic acid, polyimide, or polyamideimide, and fine particles, for example, is performed by applying the varnish to a base and by drying at atmospheric pressure or in vacuum under a condition of from 0 to 120° C. (preferably from 0 to 100° C.), and more preferably at atmospheric pressure under a condition of from 60 to 95° C. (still more preferably from 65 to 90° C.). The coating film thickness, for example, is preferably from 1 to 500 µm, and more preferably from 5 to 50 µm.

A release layer may be provided on a base, if necessary. In addition, in the formation of an unbaked composite membrane, before the [Baking of unbaked composite membrane] described below, an immersing step in a solvent including water, a drying step, and a pressing step may be provided as an optional step, respectively.

The above-described release layer can be manufactured by performing applying a release agent to a base and drying or baking the resulting product. As the release agent used here, a known release agent such as an alkyl phosphoric acid ammonium salt-based release agent, a fluorine-based release agent, or a silicone-based release agent can be used without particular limitation.

When peeling off an unbaked composite membrane after drying from the base, a slight amount of release agent remains on the release surface of the unbaked composite membrane. Since the remaining release agent can affect the wettability of the polyimide resin porous membrane surface or impurities mixing, this is preferably removed.

Therefore, the unbaked composite membrane peeled off from the base is preferably washed with an organic solvent or the like. As the washing method, known methods such as a method of removing after the unbaked composite membrane is immersed in a washing liquid and a method of shower washing can be given.

To dry the unbaked composite membrane after washing, for example, the unbaked composite membrane after washing is air-dried at room temperature or is warmed to a suitable set temperature in a thermostat. At this time, for example, it is also possible to adopt a method of preventing deformation by fixing the end portions of the unbaked composite membrane to a mold made of SUS or the like.

On the other hand, in the formation of an unbaked composite membrane, in a case where a base that is not provided with a release layer is used, a step of forming the release layer or a step of washing the unbaked composite membrane can be omitted.

In addition, in a case where an unbaked composite membrane is formed in a two-layered form, formation of a first unbaked composite membrane having a membrane thickness of from 1 to 5 µm is performed by, first, applying the first varnish to a base such as a glass substrate, and by drying at atmospheric pressure or in vacuum under a condition of from 0 to 120° C. (preferably from 0 to 90° C.), and more preferably at atmospheric pressure under a condition of from 10 to 100° C. (still more preferably from 10 to 90° C.).

Subsequently, a two-layered unbaked composite membrane can be formed by performing formation of a second unbaked composite membrane having a membrane thickness of 5 to 50 µm by applying the second varnish to the first unbaked composite membrane, and in the same manner, by drying at from 0 to 80° C. (preferably from 0 to 50° C.) and more preferably at atmospheric pressure under a condition of from 10 to 80° C. (still more preferably from 10 to 30° C.).

[Baking of Unbaked Composite Membrane]

By performing a heat treatment (baking) on the unbaked composite membrane after the above [Formation of unbaked composite membrane], a composite membrane (polyimide resin-fine particle composite membrane) formed of a polyimide resin and fine particles is formed.

In the case of including polyamic acid in the varnish, in the [Baking of unbaked composite membrane] in this step, it is preferable to complete the imidization.

The temperature (baking temperature) of the heat treatment varies depending on the presence or absence of the structure of polyamic acid, polyimide, or polyamideimide contained in the unbaked composite membrane and a condensing agent, and is preferably from 120 to 400° C., and more preferably from 150 to 375° C.

It is not always necessary to clearly divide the drying in the previous step and the operation to perform the baking. For example, in a case where baking is performed at 375° C., a method of raising the temperature from room temperature to 375° C. for 3 hours and then holding at 375° C. for 20 minutes, or a stepwise drying-thermal imidization method of raising (holding for 20 minutes at each stage) the temperature stepwise to 375° C. with a 50° C. increment from room temperature and finally holding at 375° C. for 20 minutes can also be used. At this time, a method of preventing deformation by fixing the end portions of the unbaked composite membrane to a mold made of SUS or the like may be adopted.

The thickness of the polyimide resin-fine particle composite membrane after the heat treatment (baking), for example, is preferably 1 µm or greater, more preferably from 5 to 500 µm, and still more preferably from 8 to 100 µm.

The thickness of the polyimide resin-fine particle composite membrane can be determined by measuring the thickness of a plurality of positions using a micrometer and by averaging these.

This step is an optional step. In particular, in a case where polyimide or polyamideimide is used in varnish, this step may not be performed.

[Removal of Fine Particles]

By removing the fine particles from the non-polyimide resin-fine particle composite membrane after the above [Baking of unbaked composite membrane], a polyimide resin porous membrane is produced.

For example, in a case where silica is adopted as fine particles, by the polyimide resin-fine particle composite membrane coming into contact with hydrogen fluoride (HF) water having a low concentration, the silica is dissolved and removed, and a porous membrane is obtained. In addition, in a case where the fine particles are resin fine particles, by heating at the thermal decomposition temperature of the resin particles or higher and at a temperature lower than the thermal decomposition temperature of the polyimide resin, the resin fine particles are decomposed and removed, and a porous membrane is obtained.

[Etching (Ring-Opening of Imide Bond)]

The etching step can be performed by a chemical etching method or a physical removal method, or a combined method thereof.

For Chemical Etching Method

As the chemical etching method, a conventionally known method can be used.

The chemical etching method is not particularly limited, and treatments with an etching liquid such as an inorganic alkali solution or an organic alkaline solution can be given. Among these, a treatment with an inorganic alkali solution is preferable.

Examples of the inorganic alkali solution include a hydrazine solution including hydrazine hydrate and ethylenediamine; a solution of an alkali metal hydroxide such as potassium hydroxide, sodium hydroxide, sodium carbonate, sodium silicate, or sodium metasilicate; an ammonia solution; and an etching liquid mainly having alkali hydroxide, hydrazine, and 1,3-dimethyl-2-imidazolidinone.

Examples of the organic alkali solution include alkaline etching liquids of primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. The alkali concentration in the etching liquid, for example, is from 0.01 to 20% by weight.

The solvent of each etching liquid described above can be suitably selected from pure water and alcohols, and a solvent in which a suitable amount of surfactant has been added can also be used.

For Physical Removal Method

As the physical removal method, for example, a dry etching method by plasma (oxygen, argon, or the like), corona discharge, or the like can be used.

The chemical etching method or the physical removal method described above can also be applied before the above [Removal of fine particles], or can also be applied after the above [Removal of fine particles].

Among these, from the viewpoint of the fact that the communicating pores inside the polyimide resin porous membrane are more easily formed, and the removability of foreign matters is increased, it is preferable to apply after the above [Removal of fine particles].

In a case where the chemical etching method is performed in the etching step, to remove the excessive etching liquid, the step of washing the polyimide resin porous membrane may be provided after this step.

Washing after the chemical etching may be performed with water alone, and it is preferable to combine washing with an acid and washing with water.

In addition, after the etching step, for wettability improvement to an organic solvent of the polyimide resin porous membrane surface and the remaining organic material removal, a heat treatment (rebaking) may be performed on, the polyimide resin porous membrane. The heating conditions are the same as conditions in the above [Baking of unbaked composite membrane].

For example, in the same manner as in the embodiment shown in FIG. 2, in the polyimide resin porous membrane produced by the production method described above, the spherical cells 1 and the communicating pores through which the adjacent spherical cells 1 are mutually communicating are formed, and the polyimide resin porous membrane preferably has communicating pores by which a flow path through which a fluid can pass the polyimide resin porous membrane 10 by the communicating pores which are open on the external surface of one side communicating with the inside of the polyimide resin porous membrane 10 and by being open on the external surface of the other side (back side) is secured.

The Gurley air permeability of the polyimide resin porous membrane, for example, is preferably 30 seconds or longer from the viewpoint of the fact that the flow rate of an object of filtering passing through the porous membrane is maintained at a high level to some extent and removal of the foreign matters is efficiently performed. The Gurley air permeability of the polyimide resin porous membrane is more preferably from 30 to 1000 seconds, still more preferably from 30 to 600 seconds, particularly preferably from 30 to 500 seconds, and most preferably from 30 to 300 seconds. If the Gurley air permeability is a preferable upper limit value or less within the above range, the degree of porosity (abundance ratio of communicating pores) is sufficiently high, and thus, the effects of removal of foreign matters are more easily obtained.

The Gurley air permeability of the polyimide resin porous membrane can be measured according to JIS P 8117.

The polyimide resin porous membrane preferably includes communicating pores of which the pore diameter is from 1 to 200 nm, more preferably from 3 to 180 nm, still more preferably from 5 to 150 nm, and particularly preferably from 10 to 130 nm.

The pore diameter of the communicating pores means the diameter of the communicating pores. Since one communicating pore is formed from typical two adjacent particles by the production method described above, for example, if the direction in which two pores constituting communicating pores are adjacent is a longitudinal direction, in the diameter, a case where a diameter is in the direction perpendicular to the longitudinal direction is included.

In a case where the etching step (ring-opening of an imide bond) described above is not provided, the pore diameter of the communicating pores tends to be reduced.

In addition, the average pore diameter of the polyimide resin porous membrane is preferably from 100 to 2000 nm, more preferably from 200 to 1000 nm, and still more preferably from 300 to 900 nm.

The average pore diameter of the polyimide resin porous membrane is a value obtained by measuring the diameter of the communicating pore of a porous membrane (e.g., a polyimide porous membrane) subjected to the chemical etching described above on the basis of a bubble point method using a perm porometer (e.g., Porous Materials INC.).

For the porous membrane (e.g., polyamideimide porous membrane) on which the chemical etching has not been performed, the average particle diameter of the fine particles used in the production of a porous membrane is an average pore diameter.

The polyimide resin porous membrane of the present invention, as described above, is preferably a porous membrane containing pores having an average pore diameter of several hundreds of nanometers. Thus, for example, even microsubstances of a nanometer unit can be adsorbed or trapped in the pores and/or communicating pores in the porous membrane.

For the pore diameter of the communicating pores, the distribution of pore diameters of respective pores imparting porosity to the polyimide resin porous membrane becomes broad, and the pore diameter of the communicating pores formed of adjacent pores tends to be reduced.

From the viewpoint of reducing the pore diameter of the communicating pores, the porosity of the polyimide resin porous membrane, for example, is preferably 50% by weight or greater, more preferably from 60 to 90% by weight, still more preferably from 60 to 80% by weight, and particularly preferably about 70% by weight. If the porosity is a preferable lower limit value or greater within the above range, the effects of removal of foreign matters are more easily obtained. If the porosity is a preferable upper limit value or less within the above range, the strength of the porous membrane is further enhanced.

The porosity of the polyimide resin porous membrane is determined by calculating the ratio of the weight of the fine particles relative to the total weight of the resin and the fine particles used in the production of the porous membrane.

The polyimide resin porous membrane is excellent in mechanical characteristics such as stress and breaking elongation.

The stress of the polyimide resin porous membrane of the filtration filter, for example, is preferably 10 MPa or greater, more preferably 15 MPa or greater, and still more preferably from 15 to 50 MPa.

The stress of the polyimide resin porous membrane is a value measured under the measurement conditions of 5 mm/min using a tester after a sample having a size of 4 mm×30 mm is manufactured.

In addition, the breaking elongation of the polyimide resin porous membrane, for example, is preferably 10% GL or greater, and more preferably 15% GL or greater. The upper limit of the breaking elongation is preferably 50% GL or less, more preferably 45% GL or less, and still more preferably 40% GL or less. As the porosity of the polyimide resin porous membrane is lowered, the breaking elongation tends to become higher.

The breaking elongation of the polyimide resin porous membrane is a value measured under the measurement conditions of 5 mm/min using a tester after a sample having a size of 4 mm×30 mm is manufactured.

The thermal decomposition temperature of the polyimide resin porous membrane is preferably 200° C. or higher, more preferably 320° C. or higher, and still more preferably 350° C. or higher.

The thermal decomposition temperature of the polyimide resin porous membrane can be measured by raising the temperature to 1000° C. at a temperature raising rate of 10° C./min in an air environment.

In the polyimide resin porous membrane, an object of filtering passes through the inside of the porous membrane by flowing through communicating pores.

The polyimide resin porous membrane is not particularly limited to the shape of the pores and the communicating pores, and a porous membrane containing pores having a curved surface in the inner surface is preferable, and it is more preferable that a large number of pores in the porous membrane (preferably, the total of the inner surface of pores) are formed on the curved surface.

Here, the "having a curved surface in the inner surface" for the pores means that pores leading to porosity have a curved surface on at least a part of the inner surface.

In the polyimide resin porous membrane, by having a flow path formed of continuous communicating pores formed by pores having a curved surface in the inner surface, in the inner portion, the surface area of the inner surface of the pores is increased. Thus, an object of filtering is able to pass through the inner portion of the porous membrane, and when passing in contact with the curved surface of the respective pores, the contact frequency with the inner surface of the pores is increased, and by the foreign matters present in object of filtering being adsorbed by the inner surface of the pores, the foreign matters are easily removed from the object of filtering.

In the present invention, a pore in which substantially the entire inner surface of the pore in the polyimide resin porous membrane is a curved surface is referred to as a "substantially spherical pore" or a "spherical cell" in some cases. The substantially spherical pore (spherical cell) forms a space in which the inner surface of the pore is substantially spherical. The spherical cell is easily formed in a case where the fine particles used in the production method of the polyimide resin porous membrane described above is substantially spherical.

The "substantially spherical" is a concept including a sphere but not necessarily limited to a sphere, and is a concept including those which are substantially spherical. The "substantially spherical" means a pore of which the sphericity defined by major diameter/minor diameter, represented by a value obtained by dividing the major diameter by the minor diameter of a particle, is within 1±0.3. The sphericity of the spherical cell having the polyimide resin porous membrane in the present invention is preferably within 1±0.1, and more preferably within 1±0.05.

By pores in the polyimide resin porous membrane having a curved surface in the inner surface, when passing an object of filtering through the porous membrane, the object of filtering sufficiently spreads in the inner portion of the pore in the porous membrane, and it is possible to sufficiently come into contact with the inner surface of the pore, and in some cases, there is a possibility that convection occurs along the inner surface of the pore. Thus, the foreign matters present in the object of filtering become more easily adsorbed on to the inner surface of the pore in the polyimide resin porous membrane.

As the polyimide resin porous membrane, a porous membrane having a porous structure in which adjacent spherical cells are mutually communicating is particularly preferable.

The polyimide resin porous membrane having spherical cells preferably has a structure in which the spherical cells having a average spherical diameter of from 50 to 2000 nm are mutually communicating. The average diameter of the spherical cells is more preferably from 100 to 1000 nm, and still more preferably from 200 to 800 nm.

The average spherical diameter of the spherical cells refers to an average value of the diameters of the communicating pores formed from two adjacent spherical cells. The average spherical diameter of the spherical cells can be determined by the same method as that in the average pore diameter in the porous membrane described above.

In addition, the flow path which the polyimide resin porous membrane having spherical cells has in the inner portion has one or more communicating pores selected from the group consisting of communicating pores between the spherical cells, and communicating pores between the spherical cells and other cells. The diameter of the other cells is suitably determined in consideration of the size of the foreign matters removed from the object of filtering.

In addition, the spherical cells may further have a recessed part on the inner surface thereof. In the recessed part, for example, pores having a pore diameter smaller than the spherical cells, open to the inner surface of the spherical cells, may be formed.

According to the filtration filter according to the present aspect described above, an, object of filtering is filtered by a filter provided with the polyimide resin porous membrane. Thus, foreign matters such as organic materials and metallic impurities are removed from the object of filtering better than ever. In particular, by the polyimide resin porous membrane being used, high polar components and polymers which was difficult to be removed in the related art is sufficiently removed from the object of filtering, and among these, high polar polymers are specifically removed.

The filtration filter according to the present aspect, in particular, is a filtrating material preferable for filtering a liquid chemical for lithography. According to the filtration filter, impurities such as particles or the like mixed in liquid chemical for lithography, for example, a resist composition, a resin solution, a developing solution, a solvent for resist, and a pre-wetting solvent are more easily removed.

In addition, the filtration filter of the present aspect replaces the filter cartridge or the like for removing the fine particle impurities installed in the related art in the supply line or point of use (POU) of various chemical liquid in the semiconductor production process, an can be used in combination therewith. Therefore, by the exactly same apparatus and operation in the related art, various foreign matters can be efficiently removed from the object for filtering (liquid chemical for lithography), and high purity liquid chemical for lithography can be prepared.

(Second Aspect: Filtration Method)

The filtration method according to the second aspect of the present invention includes allowing a liquid chemical for lithography to pass through the filtration filter of the first aspect. By the operation, impurities such as particles mixed with liquid chemicals or the like are removed.

The operation may be performed in a state without a pressure difference (i.e., a liquid chemical for lithography may be passed through by gravity only with respect to the filtration filter), or may be performed in a state in which a pressure difference is applied. Among these, the latter is preferable, and an operation of allowing a liquid chemical for lithography to pass through a filtration filter by pressure difference is preferably performed.

The "state in which a pressure difference is applied" means that there is a pressure difference between the one side and the other side of the polyimide resin porous membrane provided in the filtration filter.

For example, the pressurization (positive pressure) which is a pressure applied to one side (supplying side of a liquid chemical for lithography) of the polyimide resin porous membrane and the reduced pressure (negative pressure) which makes one side (filtrate side) of the polyimide resin porous membrane a minus pressure can be given, and among these, the former, that is, the pressurization, is preferable.

The pressurization is that pressure is applied to the feed solution, side of the polyimide resin porous membrane in which a liquid chemical for lithography (hereinafter, referred to as the "feed solution") before passing the polyimide resin porous membrane is present.

For example, utilizing the flow fluid pressure occurring in circulation or feeding flow of a feed solution or by utilizing a positive pressure of gas, pressure is preferably applied to the feed solution side.

The flow fluid pressure can be generated, for example, by an aggressive flow fluid pressure application method of a pump (a feeding flow pump, a circulation pump, or the like). Examples of the pump include a rotary pump, a diaphragm pump, a metering pump, a chemical pump, a plunger pump, a bellows pump, a gear pump, a vacuum pump, a air pump, and a liquid pump.

In a case where circulation or feeding of the feed solution by a pump is performed, typically, the pump is disposed between the feed solution tank (or circulation vessel) and the polyimide resin porous membrane.

When a feed solution is passed through the polyimide resin porous membrane by gravity only, the flow fluid pressure, for example, may be a pressure applied to the polyimide resin porous membrane by the feed solution, but is preferably a pressure applied by the aggressive flow fluid pressure application method described above.

As the gas used for pressurization, a gas inert or non-reactive with respect to the feed solution is preferable, and specifically, noble gases such as nitrogen, helium, and argon can be given.

As a method of applying pressure to the feed solution side, it is preferable to use a positive pressure of gas. At that time, the filtrate side which has passed through the polyimide resin porous membrane may be atmospheric pressure without performing reduction of pressure.

In addition, pressurization may be one that utilizes both a flow fluid pressure and a positive pressure of gas. In addition, the pressure difference nay be combination of pressurization and pressure reduction, and for example, may be one utilizing both a flow fluid pressure and reduced pressure, one utilizing both a positive pressure of gas and reduced pressure, or one utilizing a flow fluid pressure, a positive pressure of gas, and reduced pressure. In the case of combining methods of providing a pressure difference, from the viewpoint of convenience of production, combination of a flow fluid pressure and a positive pressure of gas or combination of a flow fluid pressure and pressure reduction is preferable.

In the present invention, from the viewpoint of suing the polyimide resin porous membrane, the method of providing a pressure difference, for example, may be a one method such as a positive pressure by gas, and has excellent foreign matter removal performance.

The pressure reduction is to depressurize the filtrate side which has passed through the polyimide resin porous membrane, and for example, may be pressure reduction by a pump, and it is preferable to reduce the pressure to vacuum.

In the case of performing an operation in which a liquid chemical for lithography is passed through a filtration filter in the state in which a pressure difference is provided, the pressure difference is suitably set in consideration of the film thickness of the polyimide resin porous membrane used, the porosity or the average pore diameter, the desired purity, the amount of fluid flowing, the flow rate, or the concentration or the viscosity of a feed solution. For example, the pressure difference in the case of a so-called cross flow method (feed solution flows parallel to the polyimide resin porous membrane), for example, is preferably 3 MPa or less, and the pressure difference in the case of a so-called dead-end method (feed solution flows to intersect the polyimide resin porous membrane), for example, is preferably 1 MPa or less. The lower limit value of each of the pressure differences is not particularly limited, and for example, is preferably 10 Pa or greater.

The operation in which a liquid chemical for lithography is passed through a filtration filter provided with the polyimide resin porous membrane can be performed in a state in which the flow rate of the liquid chemical for lithography (feed solution) is maintained to be high.

The flow rate in this case is not particularly limited, and for example, the flow rate of pure water in the case of being pressurized to 0.08 MPa at room temperature (20° C.) is preferably 1 mL/min or greater, more preferably 3 mL/min or greater, still more preferably 5 mL/min or greater, and particularly preferably 10 mL/min or greater. The upper limit value of the flow rate is not particularly limited, and for example, is 50 mL/min or less.

In the present invention, since the filtration filter having the polyimide resin porous membrane described above is used, it is possible to perform filtration while maintaining a high flow rate, and the removal ratio of the foreign matters included in the liquid chemical for lithography can be increased.

In addition, an operation in which a liquid chemical for lithography is passed through a filtration filter is preferably performed by setting the temperature of the liquid chemical for lithography to from 0 to 30° C., and more preferably setting to from 5 to 25° C.

In the filtration method of the present aspect, a circulation type filtration operation in which the liquid chemical for lithography (feed solution) is passed through the polyimide resin porous membrane while being constantly circulated can be applied.

In addition, in the filtration method of the present aspect, the liquid chemical for lithography may be passed through a filtration filter provided with the polyimide resin porous membrane a plurality of times, or may be passed through a plurality of filtration filters, including at least a filtration filter provided with the polyimide resin porous membrane.

In the filtration method of the present aspect, to wash the polyimide resin porous membrane, improve wettability with respect to the feed solution, or adjust the surface energy of the polyimide resin porous membrane and the feed solution before the feed solution is passed through the polyimide resin porous membrane, an alcohol such as methanol, ethanol, or isopropyl alcohol, a ketone such as acetone or methyl ethyl ketone, water, or a solution of a solvent included in a feed solution or mixtures thereof may be passed through by bring into contact with the polyimide resin porous membrane.

To bring the above solution into contact with the polyimide resin porous membrane, the polyimide resin porous membrane may be impregnated into the solution, or may be immersed. By bring the above solution into contact with the polyimide resin porous membrane, for example, it is possible to penetrate the solution into the pores in the inside of the polyimide resin porous membrane. Contact between the above solution and the polyimide resin porous membrane may be performed in a state in which the above-described pressure difference is provided, and in particular, in the case of making the solution penetrate also into the pores in the inside of the polyimide resin porous membrane, contact is preferably performed under pressure.

According to the filtration method of the present aspect described above, by an operation in which a liquid chemical for lithography is passed through the filtration filter of the first aspect described above, impurities such as particles included in the liquid chemical for lithography are removed. Thus, foreign matters such as organic materials and metallic impurities are removed from the object of filtering (liquid chemical for lithography) better than ever. In particular, by the filtration filter having the polyimide resin porous membrane, high polar components and polymers which was difficult to be removed in the related art is sufficiently removed from the object of filtering (liquid chemical for lithography), and among these, high polar polymers are specifically removed. Therefore, in the formation of a resist pattern, generation of defects on a resist pattern after developing is further suppressed.

In addition, in the filtration method of the present aspect, metal components as an impure material are also sufficiently removed from the object of filtering (liquid chemical for lithography). In the various base components to be blended in the liquid chemical for lithography and the organic solvent, metal components such as a trace amount of metal ion impurities are included. The metal components are originally contained in the blending components in some cases, but also are incorporated from a liquid chemical transport path such as pipes or joints of production apparatuses in some cases. In the filtration method, for example, iron, nickel, zinc, and chromium which are easily blended in in the production method of a resist composition can be effectively removed.

For example, in a case where the resist composition is filtered by the filtration method of the present aspect, a purified resist composition product having a metal component concentration of preferably less than 500 ppt (parts per trillion), more preferably less than 100 ppt, and particularly preferably less than 10 ppt, can be produced.

The filtration filter in the present aspect is not limited to a filtration filter provided with a porous membrane in which a communicating pore 5 through which the spherical cell 1$a$ and the spherical cells 1$b$ adjacent as shown in FIG. 1 comprising are communicating is formed, and in addition to the communicating pore 5 through which the spherical cell 1$a$ and the spherical cells 1$b$ are communicating, the filtration filter may provided with a porous membrane in which other forms of cells or communicating pores are formed.

As other forms of cells (hereinafter, this is referred as "other cells"), cells having a different shape or pore diameter can be given, and examples thereof include ellipse shape cells, polyhedral cells, and spherical cells having a different pore diameter. As the "other forms of communicating pores" described above, for example, communicating pores through which spherical cells and other cells are communicating can be given.

The shape or pore diameter of the other cells may be suitably determined depending on the type of impurities which are removal targets. The communicating pores through which spherical cells and other cells are communicating are formed by selecting the material of the above-described fine particles, or by controlling the shape of the fine particles.

In addition to the communicating pores through which adjacent spherical cells are mutually communicating, according to the filtration filter provided with a porous membrane in which other forms of cells or communicating pores are formed, various types of foreign matters are more efficiently removed from an object of filtering.

In addition, the filter having the polyimide resin porous membrane, used in the filtration step, replaces the filter cartridge or the like for removing the fine particle impurities installed in the related art in the supply line or point of use (POU) of various chemical liquid in the semiconductor production process, an can be used in combination therewith. Therefore, by the exactly same apparatus and operation in the related art, various foreign matters can be efficiently removed from the object for filtering, and purified liquid chemical product for lithography with high purity can be produced.

(Third Aspect: Production Method of Purified Liquid Chemical Product for Lithography)

The production method of a purified liquid chemical product for lithography according to the third aspect of the present invention is a method having filtering (hereinafter, referred to as "filtration step") a liquid chemical, for lithography by the filtration method of the second aspect.

In the filtration step, a liquid chemical for lithography is filtered by the above-described <Filtration filter>, that is, filtered by filtration filter provided with the polyimide resin porous membrane.

The purified liquid chemical product for lithography produced by the production method of a purified liquid chemical product for lithography of the third aspect of the present invention is a purified liquid chemical product for lithography in which foreign matters such as organic materials and metal impurities have been removed by performing filtration through a filtration filter provided with the polyimide resin porous membrane. The purified liquid chemical product, for example, is very small fine particles having a size of 30 nm or greater.

The purified liquid chemical product for lithography produced by the production method of the present aspect is a purified liquid chemical product for lithography in which impurities have been further reduced. For example, by using a purified resist composition product produced in a case where the liquid chemical for lithography is a resist composition, generation of defects can be more reliably suppressed in the formation of a resist pattern, and a resist pattern with reduced deficiencies such as generation of scums and microbridges and good shape can be formed.

In addition, even in a case where the filtrate (purified product) obtained by filtering a liquid chemical for lithography by the filtration filter of the first aspect is stored at 40° C. for 7 days, generation of foreign matters are suppressed. That is, the purified liquid chemical product for lithography is a high purity product in which impurities have been further reduced.

(Purified Liquid Chemical Product for Lithography)

The purified liquid chemical product for lithography produced by the production method of a purified liquid chemical product for lithography of the first aspect of the present invention is a purified liquid chemical product for lithography in which foreign matters such as organic materials and metal impurities have been removed by performing filtration through a filter provided with the polyimide resin porous membrane.

The purified liquid chemical product for lithography is a purified liquid chemical product obtained by filtering through a filter provided with the polyimide resin porous membrane, and for example, a liquid chemical of very small fine particles having a size of 30 nm or greater.

In addition, after the liquid chemical for lithography is filtered by a filter provided with the polyimide resin porous membrane, the measured defect count of the filtrate (purified product of lithography for the liquid chemical for lithography) which was stored at 40° C. for 1 day becomes a smaller value.

As the value of this defect count is smaller, generation of foreign matters is further suppressed, that is, this means that a liquid chemical for lithography has small foreign matters, and high purity.

For example, as the purified liquid chemical product for lithography, in a resist composition produced by using a purified resin solution product obtained by dissolving a resin component for resist in an organic solvent component, the value of the defect count is small, and generation defects in the resist pattern after development is further suppressed, and thus, this is preferable.

The resist composition containing the purified resin solution product, as an example, can be produced by a production method having the following steps (i) to (iii).

Step (i): a step of obtaining a purified resin solution product by filtering a resin solution obtained by dissolving a resin component for resist in an organic solvent component by a filter provided with the polyimide resin porous membrane Step (ii): a step of obtaining a crude resist composition by mixing the purified resin solution product and other arbitrary components (the component (B), (D), (E), (F), or (S) described above)

Step (iii): a step of filtering the crude resist composition by a filter provided with the polyimide resin porous membrane or a filter in, the related art.

In addition, according to the production method of the purified liquid chemical product for lithography of the first aspect, the purified resist composition product in which generation of defects in the resist pattern after development is further suppressed can be produced.

In the production method according to the present invention, in the filtration step, the resist composition which is an object of filtering is filtered by a filter provided with the polyimide resin porous membrane. Thus, foreign matters such as organic materials and metallic impurities are removed from the resist composition which is an object of filtering better than ever. In particular, by the polyimide resin porous membrane being used, high polar components and polymers which was difficult to be removed in the related art is sufficiently removed from the resist composition which is an object of filtering, and among these, high polar polymers are specifically removed. Therefore, generation of defects on a resist pattern after developing is further suppressed.

In addition, in the filtration step of the present invention, metal components as an impure material are also sufficiently removed from the object of filtering. In the various base components to be blended in the resist composition and the organic solvent, metal components such as a trace amount of metal ion impurities are included. The metal components are originally contained in the blending components in some cases, but also are incorporated from a liquid chemical transport path such as pipes or joints of production apparatuses in some cases. In the filtration step, for example, iron, nickel, zinc, and chromium which are easily blended in the production method of a resist composition can be effectively removed.

The metal component concentration of the purified resist composition product after the filtration step, for example, is preferably less than 500 ppt (parts per trillion), more preferably less than 100 ppt, and particularly preferably less than 10 ppt, by being filtered by a filter provided with the polyimide resin porous membrane.

(Fourth Aspect: Method for Forming Resist Pattern)

The method of forming a resist pattern according to the fourth aspect of the present invention has filtering a resist composition containing a base component (A) which exhibits changed solubility in an alkali developing solution under action of acid and an organic solvent (S), and having an acid generation ability by a filter provided with a polyimide resin porous membrane to obtain a purified resist composition product; using the purified resist composition product to form a resist film on a substrate; exposing the resist film; and developing the exposed resist film to form a resist pattern.

The method for forming a resist pattern according to the present embodiment can be performed, for example, as follows.

First, the purified resist composition product is applied to a substrate using a spinner or the like, then, a bake treatment (post applied bake (PAB)) is conducted under a temperature condition of from 80 to 150° C. for from 40 to 120 seconds, and preferably from 60 to 90 seconds, whereby a resist film is formed.

The purified resist composition product is obtained by using a resist composition as a liquid chemical for lithography in the production, method of the purified liquid chemical product for lithography of the first aspect.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of from 80 to 150° C. for from 40 to 120 seconds, and preferably from 60 to 90 seconds.

Next, the resist film is subjected to a developing treatment. The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, residual developing solution or rinse liquid adhered to the pattern following the developing treatment or rinse treatment may be removed by treatment using a supercritical fluid.

After the developing treatment or the rinse treatment, drying is conducted. If desired, bake treatment (post bake) can be conducted following the developing.

In this manner, a resist pattern can be formed.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The purified resist composition product has high usefulness for a KrF excimer laser, an ArF excimer laser, EB, or EUV, and is particularly useful for an ArF excimer laser, EB or EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed: The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within, a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a from 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(=O)—C within the structure thereof. An ester solvent is an organic solvent containing C—C(=O)—O—C within the structure thereof. An alcohol solvent is an organic solvent containing an alcoholic hydroxy group in the structure thereof. An "alcoholic hydroxy group" refers to a hydroxy group bonded to a carbon atom of an aliphatic hydrocarbon group. A nitrile solvent is an organic solvent containing a nitrile group in the structure thereof. An amide solvent is an organic solvent containing an amide group within the structure thereof. An ether solvent is an organic solvent containing C—O—C within the structure thereof.

Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents and nitrile solvents are preferable.

If desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

When a surfactant is added, the amount thereof based on the total amount of the organic developing solution is generally 0.001 to 5% by weight, preferably 0.005 to 2% by weight, and more preferably from 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in the case of a solvent developing process, any of the aforementioned organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

As the organic solvent, one kind of solvent may be used alone, or two or more kinds of solvents may be used in combination. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the rinse solution may have a conventional additive blended. Examples of the additive include surfactants. Examples of the additive include surfactants. Examples of the additive include surfactants. As the surfactant, the same surfactants as those described above can be mentioned, a non-ionic surfactant is preferable, and a non-ionic fluorine surfactant or a non-ionic silicon surfactant is more preferable.

When a surfactant is added, the amount thereof based on the total amount of the rinse liquid is generally 0.001 to 5% by weight, preferably 0.005 to 2% by weight, and more preferably from 0.01 to 0.5% by weight.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

According to the method of forming a resist pattern of the present aspect, a purified resist composition product which passed through a filter provided with the polyimide resin porous membrane is used, and thus, generation of defects can be more reliably suppressed in the formation of a resist pattern, and a resist pattern with reduced deficiencies such as generation of scums and microbridges and good shape can be formed.

In the method of forming a resist pattern of the present aspect, after being filtered by a filter provided with the polyimide resin porous membrane, the defect count of the resist pattern formed by using the filtrate (purified resist composition product) which was stored at 40° C. for 1 day becomes a smaller value.

It means that as the value of this defect count is smaller, generation of defects is further suppressed, and the formed resist pattern has low failure such as generation of scums and microbridges, and a good shape.

The defect count of the resist pattern is determined by measuring the total number of defects (total number of defects, unit: number) in the substrate using a surface defect observation apparatus (manufactured by KLA-TENCOR CORPORATION).

As described above, according to the purified resist composition product produced by the production method of the purified liquid chemical product for lithography of the first aspect, even in the case of being stored at 40° C. for 1 day, generation of defects in the resist pattern after development is suppressed.

(Fifth Aspect: Filtration Filter)

The filtration filter according to the fifth aspect of the present invention has a porous structure in which adjacent spherical cells are mutually communicating, and is a filtrating material preferable for filtering a liquid chemical for lithography.

<Liquid Chemical for Lithography>

The liquid chemical for lithography which is an object of filtering is not particularly limited, and examples thereof include the same as the liquid chemical for lithography in the first aspect.

<Filtration Filter>

The filtration filter according to the present aspect has a porous structure in which adjacent spherical cells are mutually communicating.

For example, the filtration filter may be a filter formed of a simple substance of the porous membrane in which adjacent spherical cells are mutually communicating, or may be a filter obtained by using other filtering material together with the porous membrane.

Examples of other filtering material include the same as other filtering material of the filtration filter in the first aspect.

For "Porous Membrane in which Adjacent Spherical Cells are Mutually Communicating"

The "porous membrane in which adjacent spherical cells are mutually communicating" provided with the filtration filter has communicating pores through which the adjacent spherical cells are mutually communicating.

The communicating pores are formed by respective pores (cells) imparting porosity to the porous membrane. In the pores, a pore in which substantially the entire inner surface of the pore is a curved surface is included, and other shape of pores may be included.

In the present invention, a pore in which substantially the entire inner surface of the pore is a curved surface is referred to as a "spherical cell" or a "substantially spherical pore".

The definitions of the spherical cells (substantially spherical pores) and "substantially spherical" are the same as those in the first aspect.

FIG. 1 schematically shows one embodiment of communicating pores which constitute a porous membrane.

In the porous membrane of the present embodiment, substantially the entire inner surface of each of a spherical cell 1a and a spherical cell 1b is a curved surface, and a substantially spherical shape space is formed.

The spherical cell 1a and the spherical cell 1b are adjacent to each other, and a communicating pores 5 through which the overlapping portion Q between the adjacent spherical cell 1a and spherical cell 1b penetrates is formed. The object of filtering, for example, flows through the inside of the communicating pore 5 in the direction (direction indicated by an arrow) of the spherical cell 1b from the spherical cell 1a.

Thus, the porous membrane having a structure in which the adjacent spherical cells are mutually communicating, it is preferable that a plurality of pores (spherical cells, communicating pores) are connected, and a flow path of an object of filtering is formed as a whole.

The "flow path" is typically formed by respective "pores" and/or "communicating pores" being mutually communicating. The respective pores, for example, are formed by the respective fine pores present in a polyimide resin-fine particle composite membrane being removed in the following step, in the production method of the polyimide resin porous membrane described below. In addition, the communicating pores are adjacent pores formed by the fine particles being removed in the following step at the portion where the respective fine pores present in a polyimide resin-fine particle composite membrane are in contact with each other, in the production method of the polyimide resin porous membrane described below.

FIG. 2 is a SEM image of the surface of the resin porous membrane according to the present embodiment by a scanning electron microscope (accelerating voltage of 5.0 kV, product name: S-9380, manufactured by Hitachi High-Technologies Corporation).

A porous membrane 10 of the present embodiment has a porous structure in which adjacent spherical cells 1 are mutually communicating.

In the porous membrane 10, the spherical cells 1 and the communicating pores through which the adjacent spherical cells 1 are mutually communicating are formed, and the extent of porosity becomes high. In addition, in the porous membrane 10, the spherical cells 1 or the communicating pores are open on the porous membrane 10 surface, the communicating pores open on the surface of one side are open on the surface of the other side (back side) by communicating the inside of the porous membrane 10, and a flow path through which a fluid can pass the inside of the porous membrane 10 is formed. According to the porous membrane 10, by an object of filtering flowing through the flow path, foreign matters included in the object of filtering are removed from the object of filtering before filtration.

Since the porous membrane 10 has a flow path formed of continuous communicating pores formed by the spherical cells 1 having a curved surface in the inner surface in the inner portion, the surface area of the inner surface of the spherical cells 1 is large. Thus, since an object of filtering is able to pass through the inner portion of the porous membrane 10, and when passing in contact with the curved surface of the respective spherical cells 1, the contact frequency with the inner surface of the spherical cells 1 is increased, by the foreign matters present in object of filtering being adsorbed by the inner surface of the spherical cells 1, the foreign matters are easily removed from the object of filtering.

The porous membrane 10 has a structure in which the spherical cells 1 having a average spherical diameter of from 50 to 2000 nm are mutually communicating. The average diameter of the spherical cells 1 is more preferably from 100 to 1000 nm, and still more preferably from 200 to 800 nm.

The average spherical diameter of the spherical cells 1 refers to an average value of the diameters of the communicating pores formed from two adjacent spherical cells. The average spherical diameter of the spherical cells 1 is a value obtained by measuring the diameter of the pore based on the bubble point method using a perm porometer (e.g., Porous Materials INC.). Specifically, the average spherical diameter can be determined by the same method as that in the average pore diameter in the porous membrane described above.

The flow path which the "porous membrane in which adjacent spherical cells are mutually communicating" has in the inner portion may have communicating pores including other shape of pores or this, in addition to the spherical cells and the communicating pores between the spherical cells.

In addition, the spherical cells may further have a recessed part on the inner surface thereof. In the recessed part, for example, pores having a pore diameter smaller than the spherical cells, open to the inner surface of the spherical cells, may be formed.

As the "porous membrane in which adjacent spherical cells are mutually communicating", a membrane containing a resin can be given, and may be formed of substantially a resin alone, and a membrane in which the resin is preferably 95% by weight or greater, more preferably 98% by weight or greater, and still more preferably 99 by weight or greater, of the entire porous membrane can be given.

The porous membrane preferably contains a thermosetting resin from the viewpoint of removability of foreign matters and strength.

Examples of the thermosetting resin here include polyimide, polyamideimide, a polybenzoxazole resin, a polybenzimidazole resin, aromatic nylon, a polyvinylidene fluoride resin, and polyallylsulfone.

Among these, the porous membrane preferably contains at least one of polyimide or polyamideimide, more preferably at least polyimide, as a resin, and may contain polyimide alone or polyamideimide alone as a resin.

The "porous membrane in which adjacent spherical cells are mutually communicating" is particularly preferably at least one of polyimide and polyamideimide which is 95% by weight or greater of the entire porous membrane.

In the present specification, the "polyimide resin" means any one of polyimide and polyamideimide, or both. The polyimide and the polyamideimide may respectively have at least one functional group selected from the group consisting of a carboxy group, a salt type carboxy group, and an —NH— bond.

The porous membrane containing at least one of polyimide and polyamideimide is referred to as the "polyimide resin porous membrane", in some cases.

The porous membrane (polyimide resin porous membrane) in which adjacent spherical cells are mutually communicating, containing a polyimide resin as the resin has the same meaning as the polyimide resin porous membrane in the first aspect.

For example, in the same manner as in the embodiment shown in FIG. 2, in the polyimide resin porous membrane produced by the production method described above, the spherical cells 1 and the communicating pores through which the adjacent spherical cells 1 are mutually communicating are formed, and the polyimide resin porous membrane preferably has communicating pores by which a flow path through which a fluid can pass the porous membrane 10 by the communicating pores which are open on the external surface of one side communicating with the inside of the porous membrane 10 and by being open on the external surface of the other side (back side) is secured.

The Gurley air permeability of the "porous membrane in which adjacent spherical cells are mutually communicating" of the present invention, for example, is preferably 30 seconds or longer from the viewpoint of the fact that the flow rate of an object of, filtering passing through the porous membrane is maintained at a high level to some extent and removal of the foreign matters is efficiently performed. The Gurley air permeability of the porous membrane is more preferably from 30 to 1000 seconds, still more preferably from 30 to 600 seconds, particularly preferably from 30 to 500 seconds, and most preferably from 30 to 300 seconds. If the Gurley air permeability is a preferable upper limit value or less within the above range, the degree of porosity (abundance ratio of communicating pores) is sufficiently high, and thus, the effects of removal of foreign matters are more easily obtained.

The Gurley air permeability of the porous membrane can be measured according to JIS P 8117.

The "porous membrane in which adjacent spherical cells are mutually communicating" of the present invention preferably includes communicating pores of which the pore diameter is from 1 to 200 nm, more preferably from 3 to 180 nm, still more preferably from 5 to 150 nm, and particularly preferably from 10 to 130 nm.

The pore diameter of the communicating pores means the diameter of the communicating pores. Since one communicating pore is formed from typical two adjacent particles by the production method described above, for example, if the direction in which two pores constituting communicating pores are adjacent is a longitudinal direction, in the diameter, a case where a diameter is in the direction perpendicular to the longitudinal direction is included.

In a case where the etching step (ring-opening of an imide bond) described above is not provided, the pore diameter of the communicating pores tends to be reduced.

In addition, the average pore diameter of the "porous membrane in which adjacent spherical cells are mutually communicating" of the present invention is preferably from 100 to 2000 nm, more preferably from 200 to 1000 nm, and still more preferably from 300 to 900 nm.

The average pore diameter of the porous membrane is a value obtained by measuring the diameter of the communicating pore of a porous membrane (e.g., a polyimide porous membrane) subjected to the chemical etching described above on the basis of a bubble point method using a perm porometer (e.g., Porous Materials INC.). For the porous membrane (e.g., polyamideimide porous membrane) on which the chemical etching has not been performed, the average particle diameter of the fine particles used in the production of a porous membrane is an average pore diameter.

The "porous membrane in which adjacent spherical cells are mutually communicating" of the present invention, as described above, is preferably a porous membrane containing pores having an average pore diameter of several hundreds of nanometers. Thus, for example, even, microsubstances of a nanometer unit can be adsorbed or trapped in the pores and/or communicating pores in the porous membrane.

For the pore diameter of the communicating pores, the distribution of pore diameters of respective pores imparting porosity to "porous membrane in which adjacent spherical cells are mutually communicating" becomes broad, and the pore diameter of the communicating pores formed of adjacent pores tends to be reduced.

From the viewpoint of reducing the pore diameter of the communicating pores, the porosity of the "porous membrane in which adjacent spherical cells are mutually communicating", for example, is preferably 50% by weight or greater, more preferably from 60 to 90% by weight, still more preferably from 60 to 80% by weight, and particularly preferably about 70% by weight. If the porosity is a preferable lower limit value or greater within the above range, the effects of removal of foreign matters are more easily obtained. If the porosity is a preferable upper limit value or less within the above range, the strength of the porous membrane is further enhanced.

The porosity of the porous membrane is determined by calculating the ratio of the weight of the fine particles relative to the total weight of the resin and the fine particles used in the production of the porous membrane.

The "porous membrane in which adjacent spherical cells are mutually communicating" is excellent in mechanical characteristics such as stress and breaking elongation.

The stress of the "porous membrane in which adjacent spherical cells are mutually communicating" of the filtration filter, for example, is preferably 10 MPa or greater, more preferably 15 MPa or greater, and still more preferably from 15 to 50 MPa.

The stress of the porous membrane is a value measured under the measurement conditions of 5 mm/min using a tester after a sample having a size of 4 mm×30 mm is manufactured.

In addition, the breaking elongation of the "porous membrane in which adjacent spherical cells are mutually communicating", for example, is preferably 10% GL or greater, and more preferably 15% GL or greater. The upper limit of the breaking elongation is preferably 50% GL or less, more preferably 45% GL or less, and still more preferably 40% GL or less. As the porosity of the polyimide resin porous membrane is lowered, the breaking elongation tends to become higher.

The breaking elongation of the porous membrane is a value measured under the measurement conditions of 5 mm/min using a tester after a sample having a size of 4 mm×30 mm is manufactured.

The thermal decomposition temperature of the "porous membrane in which adjacent spherical cells are mutually communicating" is preferably 200° C. or higher, more preferably 320° C. or higher, and still more preferably 350° C. or higher.

The thermal decomposition temperature of the porous membrane can be measured by raising the temperature to 1000° C. at a temperature raising rate of 10° C./min in an air environment.

According to the filtration filter according to the present aspect described above, an object of filtering is filtered by a filter having a porous structure in which adjacent spherical cells are mutually communicating. Thus, foreign matters such as organic materials and metallic impurities are removed from the object of filtering better than ever. In particular, by the polyimide resin porous membrane being used, high polar components and polymers which were difficult to be removed in the related art is sufficiently removed from the object of filtering, and among these, high polar polymers are specifically removed.

The filtration filter according to the present aspect is a filtrating material preferable for filtering a liquid chemical for lithography. According to the filtration filter, impurities such as particles or the like mixed in liquid chemical for lithography, for example, a resist composition, a resin solution, a developing solution, a solvent for resist, and a pre-wetting solvent are more easily removed.

The filtration filter of the present aspect is not limited to a filtration filter provided with a porous membrane in which a communicating pore 5 through which the spherical cell 1a and the spherical cells 1b adjacent as shown in FIG. 1 comprising are communicating is formed, and in addition to the communicating pore 5, the filtration filter may provided with a porous membrane in which other forms of cells or communicating pores are formed.

As other forms of cells (hereinafter, this is referred as "other cells"), cells having a different shape or pore diameter can be given, and examples thereof include ellipse shape cells, polyhedral cells, and spherical cells having a different pore diameter. As the "other forms of communicating pores" described above, for example, communicating pores through which spherical cells and other cells are communicating can be given.

The shape or pore diameter of the other cells may be suitably determined depending on the type of impurities which are removal targets. The communicating pores through which spherical cells and other cells are communicating can be formed by selecting the material of the above-described fine particles, or by controlling the shape of the fine particles.

In addition to the communicating pores through which adjacent spherical cells are mutually communicating, according to the filtration filter provided with a porous membrane in which other forms of cells or communicating pores are formed, various types of foreign matters are more efficiently removed from an object of filtering.

In addition, the filtration filter of the present aspect replaces the filter cartridge or the like for removing the fine particle impurities installed in the related art in the supply line or point of use (POU) of various chemical liquid in the semiconductor production process, and can be used in combination therewith. Therefore, by the exactly same apparatus and operation in the related art, various foreign matters can be efficiently removed from the object for filtering (liquid chemical for lithography), and high purity liquid chemical for lithography can be prepared.

(Sixth Aspect: Filtration Method)

The filtration method according to the sixth aspect of the present invention includes an operation of allowing a liquid chemical for lithography to pass through the filtration filter of the first aspect. By the operation, impurities such as particles mixed with liquid chemicals or the like are removed.

The description of the filtration method of the sixth aspect is the same as the description of the filtration method of the second aspect.

According to the filtration method of the present aspect described above, by an operation in which a liquid chemical for lithography is passed through the filtration filter of the fifth aspect described above, impurities such as particles included in the liquid chemical for lithography are removed. Thus, foreign matters such as organic materials and metallic impurities are removed from the object of filtering (liquid chemical for lithography) better than ever. In particular, by the filtration filter having a porous structure in which adjacent spherical cells are mutually communicating and a large surface area, high polar components and polymers which were difficult to be removed in the related art is sufficiently removed from the object of filtering (liquid chemical for lithography), and among these, high polar polymers are specifically removed. Therefore, in the formation of a resist pattern, generation of defects on a resist pattern after developing is further suppressed.

In addition, in the filtration method of the present aspect, metal components as an impure material are also sufficiently removed from the object of filtering (liquid chemical for lithography). In the various base components to be blended in the liquid chemical for lithography and the organic solvent, metal components such as a trace amount of metal ion impurities are included. The metal components are originally contained in the blending components in some cases, but also are incorporated from a liquid chemical transport path such as pipes or joints of production apparatuses in some cases. In the filtration method, for example, iron, nickel, zinc, and chromium which are easily blended in the production method of a resist composition can be effectively removed.

For example, in a case where the resist composition is filtered by the filtration method of the present aspect, a purified resist composition product having a metal component concentration of preferably less than 500 ppt (parts per trillion), more preferably less than 100 ppt, and particularly preferably less than 10 ppt, can be produced.

(Seventh Aspect: Production Method of Purified Liquid Chemical Product for Lithography)

The production method of a purified liquid chemical product for lithography according to the seventh aspect of the present invention is a method having filtering (hereinafter, referred to as "filtration step") a liquid chemical for lithography by the filtration method of the second aspect.

In the filtration step, a liquid chemical for lithography is filtered by the above-described <Filtration filter>, that is, filtered by a filter having a porous structure in which adjacent spherical cells are mutually communicating.

The purified liquid chemical product for lithography produced by the production method of a purified liquid chemical product for lithography of the seventh aspect of the present invention is a purified liquid chemical product for lithography in which foreign matters such as organic materials and metal impurities have been removed by performing filtration through a filtration filter having a porous structure in which adjacent spherical cells are mutually communicating. The purified liquid chemical product, for example, is very small fine particles having a size of 30 nm or greater.

The purified liquid chemical product for lithography produced by the production method of the present aspect is a purified liquid chemical product for lithography in which impurities have been further reduced. For example, by using a purified resist composition product produced in a case where the liquid chemical for lithography is a resist composition, generation of defects can be more reliably suppressed in the formation of a resist pattern, and a resist pattern with reduced deficiencies such as generation of scums and microbridges and good shape can be formed.

In addition, even in a case where the filtrate (purified product) obtained by filtering a liquid chemical for lithography by the filtration filter of the fifth aspect is stored at 40° C. for 7 days, generation of foreign matters are suppressed. That is, the purified liquid chemical product for lithography is a high purity product in which impurities have been further reduced.

(Eighth Aspect: Method for Forming Resist Pattern)

The method of forming a resist pattern according to the eighth aspect of the present invention has filtering a resist composition containing a base component (A) which exhibits changed solubility in an alkali developing solution under action of acid and an organic solvent (S), and having an acid generation ability by a filter having a porous structure in which adjacent spherical cells are mutually communicating to obtain a purified resist composition product; using the purified resist composition product to form a resist film on a substrate; exposing the resist film; and developing the exposed resist film to form a resist pattern.

The method for forming a resist pattern according to the present aspect can be performed in the same manner as in the fourth aspect.

According to the method of forming a resist pattern of the present aspect, a purified resist composition product which passed through a filter having a porous structure in which adjacent spherical cells are mutually communicating is used, and thus, generation of defects can be more reliably suppressed in the formation of a resist pattern, and a resist pattern with reduced deficiencies such as generation of scums and microbridges and good shape can be formed.

In the method of forming a resist pattern of the present aspect, after being filtered by a filter having a porous structure in which adjacent spherical cells are mutually communicating, the defect count of the resist pattern formed by using the filtrate (purified resist composition product) which was stored at 40° C. for 1 day becomes a smaller value.

It means that as the value of this defect count is smaller, generation of defects is further suppressed, and the formed resist pattern has low failure such as generation of scums and microbridges, and a good shape.

The defect count of the resist pattern is determined by measuring the total number of defects (total number of defects, unit: number) in the substrate using a surface defect observation apparatus (manufactured by KLA-TENCOR CORPORATION).

As described above, according to the purified resist composition product produced by the production method of the purified liquid chemical product for lithography of the seventh aspect, even in the case of being stored at 40° C. for one day, generation of defects in the resist pattern after development is suppressed.

EXAMPLES

As follows is a description of examples of the present invention, although the scope of the present invention is by no way limited by these examples.

<Production of Filtration Filter>

By using the raw materials shown below, a filtration filter provided with a polyimide porous membrane and a filtration filter provided with a polyamideimide porous membrane were produced, respectively.

Tetracarboxylic dianhydride: pyromellitic dianhydride.
Diamine: 4,4'-diaminodiphenyl ether.
Polyamic acid solution: a reaction product of pyromellitic dianhydride with 4,4'-diaminodiphenyl ether (solid content of 21.9% by weight), and the solvent was N,N-dimethylacetamide.
Polyamideimide solution: polyamideimide including trimellitic anhydride and o-tolidine diisocyanate as polymerization components (weight average molecular weight Mw of about 30,000; solid content of 14.0% by weight), and the solvent was N-methyl-2-pyrrolidone.
Organic solvent (1): N,N-dimethylacetamide (DMAc).
Organic solvent (2): γ-butyrolactone.
Organic solvent (3): N-methyl-2-pyrrolidone (NMP).
Dispersant: polyoxyethylene secondary alkyl ether-based dispersant.
Fine particles: silica (1) (silica having volume average particle diameter of 300 nm, and the particle size distribution index of about 1.5).

As the etching liquid, an etching liquid (1) shown below was used.

Etching liquid (1)

A TMAH solution having a concentration of 1.0% by weight, and the solvent was a mixed solvent of methanol:water=4:6 (weight ratio).

«Production of Polyimide Porous Membrane»

[Preparation of Silica Dispersing Solution (a)]

23.1 parts by weight of the silica (1) was added to a mixture of 23.1 parts by weight of the organic solvent (1) and 0.1 parts by weight of a dispersant, and the resulting product was stirred, whereby a silica dispersing solution (a) was prepared.

[Preparation of Varnish]

42.0 parts by weight of the silica dispersing solution (a) was added to 41.1 parts by weight of a polyamic acid solution.

Next, the total 66.9 parts by weight of the organic solvent (1) and the organic solvent (2) was added thereto such that the solvent composition in the entire varnish became organic solvent (1):organic solvent (2)=90:10 (weight ratio), and the resulting product was stirred, whereby a varnish was prepared.

The volume ratio between the polyamic acid and the silica in the obtained varnish was 40:60 (weight ratio of 30:70).

[Formation of Unbaked Composite Membrane]

The varnish obtained in the above [Preparation of varnish] was applied to a PET film as a base using an applicator. Next, the resulting product was prebaked at 90° C. for 5 minutes, whereby a coating film having a thickness of 40 μm was formed. Next, the formed coating film was immersed in water for 3 minutes. Thereafter, the coating film was pressed through between two rolls. At that time, the roll suppressing pressure was 3.0 kg/cm$^2$, the roll temperature was 80° C., and the moving speed of the unbaked composite membrane was 0.5 m/min. After the pressing, the coating film was peeled off from the base, whereby an unbaked composite membrane was obtained.

[Baking of Unbaked Composite Membrane]

By performing a heat treatment (baking) for 15 minutes at a baking temperature of 400° C. on the unbaked composite membrane obtained in the above [Formation of unbaked composite membrane] to imidize, a polyimide-fine particle composite membrane was obtained.

[Removal of Fine Particles]

By immersing the polyimide-fine particle composite membrane obtained in the above [Baking of unbaked composite membrane] in a 10% HF solution for 10 minutes, the fine particles included in the composite membrane were removed.

Thereafter, washing with water and drying was performed, whereby a polyimide porous membrane (PIm (1)) was obtained.

The obtained polyimide porous membrane (PIm (1)) was observed by a scanning electron microscope (accelerating voltage of 5.0 kV, product name: S-9380, manufactured by Hitachi High-Technologies Corporation). As shown in FIG. 2, PIm (1) had a porous structure in which communicating pores through which adjacent spherical cells are mutually communicating had been formed.

[Chemical Etching]

By immersing the polyimide-fine particle composite membrane obtained in the above [Baking of unbaked composite membrane] in a 10% HF solution for 10 minutes, the fine particles included in the composite membrane were removed, whereby a porous body was obtained.

Thereafter, washing with water and drying was performed.

Next, according the chemical etching conditions shown in the "CE" column in Table 1, the porous body after washing with water and drying was immersed in a predetermined etching liquid for a predetermined period of time. The chemical etching conditions shown in Table 1 are as follows.

Condition 1: Immersing for 2 Minutes in the Etching Liquid (1).

Thereafter, by performing a heat treatment (rebaking) for 15 minutes at a rebaking temperature of 380° C., a polyimide porous membrane (PIm (2)) was obtained.

The obtained polyimide porous membrane (PIm (2)) was observed by a scanning electron microscope (accelerating voltage of 5.0 kV, product name: S-9380, manufactured by Hitachi High-Technologies Corporation). As shown in FIG. 2, PIm (2) had a porous structure in which communicating pores through which adjacent spherical cells are mutually communicating had been formed.

«Production of Polyamideimide Porous Membrane»

[Preparation of Silica Dispersing Solution (b)]

19.3 parts by weight of the silica (1), 19.3 parts by weight of the organic solvent (3), and 0.1 parts by weight of a dispersant were mixed together, and the resulting product was stirred, whereby a silica dispersing solution (b) was prepared.

[Preparation of Varnish]

35.0 parts by weight of the silica dispersing solution (b) was added to 53.6 parts by weight of a polyamideimide solution.

Next, the total 33.7 parts by weight of the organic solvent (1) and the organic solvent (3) was added thereto such that the solvent composition in the entire varnish became organic solvent (1):organic solvent (3)=5:95 (weight ratio), and the resulting product was stirred, whereby a varnish was prepared.

The volume ratio between the polyamideimide and the silica (2) in the obtained varnish was 40:60 (weight ratio of 30:70).

[Formation of Unbaked Composite Membrane]

The varnish obtained in the above [Preparation of varnish] was applied to a PET film as a base using an applicator. Next, the resulting product was prebaked at 90° C. for 5 minutes, whereby a coating film having a thickness of 40 μm was formed. Next, the formed coating film was immersed in water for 3 minutes. Thereafter, the coating film was pressed through between two rolls. At that time, the roll suppressing pressure was 3.0 kg/cm², the roll temperature was 80° C., and the moving speed of the unbaked composite membrane was 0.5 m/min. After the pressing, the coating film was peeled off from the base, whereby an unbaked composite membrane was obtained.

[Baking of Unbaked Composite Membrane]

By performing a heat treatment (baking) at 280° C. for 15 minutes on the unbaked composite membrane obtained in the above [Formation of unbaked composite membrane], a polyamideimide-fine particle composite membrane was obtained.

[Removal of Fine Particles]

By immersing the polyamideimide-fine particle composite membrane obtained in the above [Baking of unbaked composite membrane] in a 10% HF solution for 10 minutes, the fine particles included in the composite membrane were removed.

Thereafter, washing with water and drying was performed, whereby a polyamideimide porous membrane (PAIm) was obtained.

The obtained polyimide porous membrane (PAIm) was observed by a scanning electron microscope (accelerating voltage of 5.0 kV, product name: S-9380, manufactured by Hitachi High-Technologies Corporation). As shown in FIG. 2, PAIm had a porous structure in which communicating pores through which adjacent spherical cells are mutually communicating had been formed.

«Production of Filtration Filter Provided with Other Porous Membranes»

A filtration filter provided with a polyamide (nylon) porous membrane (PAm (d); pore size of 20 nm, Dispo, manufactured by Pall Corporation) was prepared.

A filtration filter provided with a polyamide (nylon) porous membrane (PAm (pou); Point of use, manufactured by Pall Corporation) was prepared.

Figure 3:
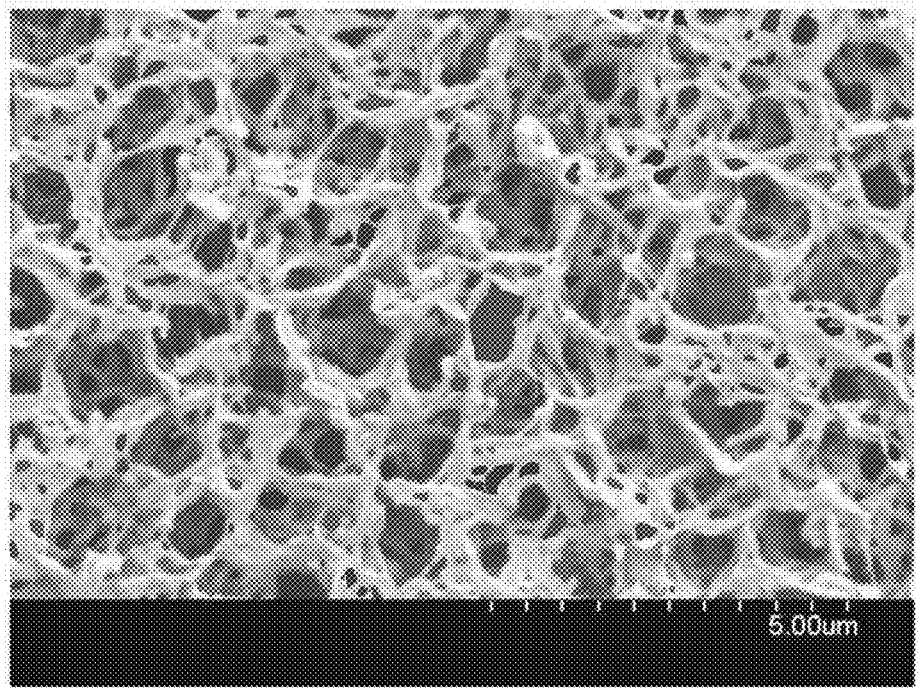
FIG. 3 is a SEM image of the surface of the polyamide (nylon) porous membrane according to the present embodiment by a scanning electron microscope.

FIG. 3 is a SEM image of the surface of the polyamide (nylon) porous membrane (PAm (d)) by a scanning electron microscope (accelerating voltage of 5.0 kV, product name: S-9380, manufactured by Hitachi High-Technologies Corporation).

As shown in FIG. 3, the surface state of PAm (d) was a form different from the form shown in FIG. 2 (i.e., porous structure in which adjacent spherical cells are mutually communicating).

The surface state of polyamide (nylon) porous membrane (PAm (pou)) was also the form as shown in FIG. 3, and a form different from the form shown in FIG. 2 (i.e., porous structure in which adjacent spherical cells are mutually communicating).

A filtration filter provided with a polyethylene porous membrane (PEm (pou); pore size of 3 nm, Point of use, manufactured by ENTEGRIS, INC.) was prepared.

Figure 4:
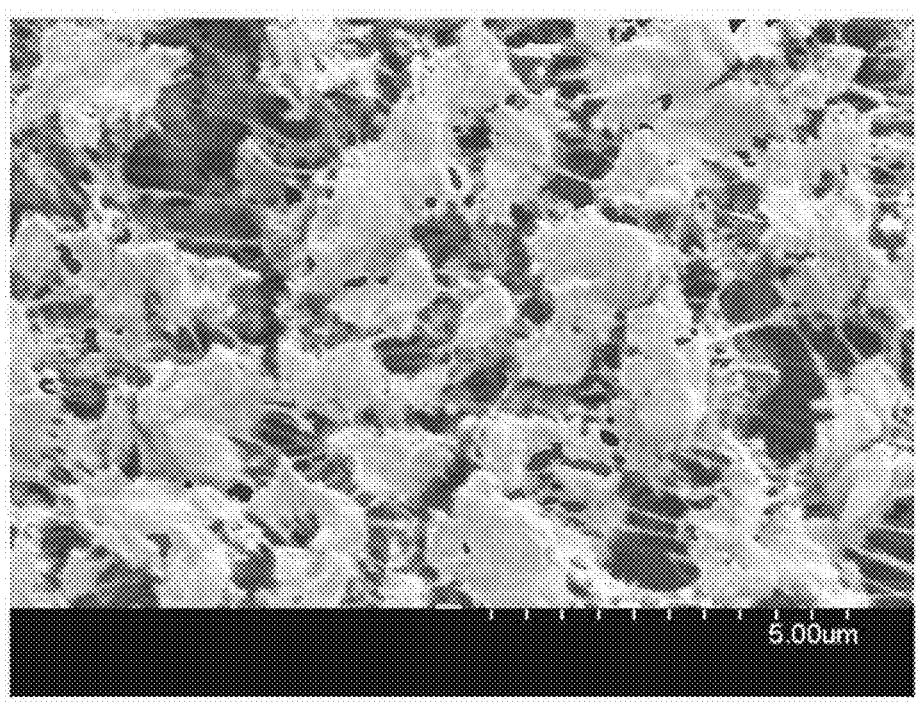
FIG. 4 is a SEM image of the surface of the polyethylene porous membrane according to the present embodiment by a scanning electron microscope.

FIG. 4 is a SEM image of the surface of the polyethylene porous membrane (PEm (pou)) by a scanning electron microscope (accelerating voltage of 5.0 kV, product name: S-9380, manufactured by Hitachi High-Technologies Corporation).

As shown in FIG. 4, the surface state of PEm (pou) was a form different from the form shown in FIG. 2 (i.e., porous structure in which adjacent spherical cells are mutually communicating).

<Evaluation of Filtration Filter>

The evaluation shown below was performed on a filter provided with a polyimide porous membrane.

[Imidization Ratio]

The imidization ratio of the polyimide porous membrane (PIm (2)) was determined.

After a heat treatment (rebaking) for 15 minutes at a rebaking temperature of 380° C. as shown in Table 1 was performed on PIm (2), the value (area ratio) obtained by dividing the area of the peak indicating an imide bond measured by a Fourier transform infrared spectroscopy (FT-IR) apparatus by the area of the peak indicating benzene measured by the same FT-IR apparatus was determined, and this was taken as an imidization ratio. The results are shown in Table 1.

[Gurley Air Permeability]

The polyimide porous membrane (PIm (2)) was cut into 5 cm square samples having a thickness of about 40 μm.

The period of time (seconds) when 100 mL of air passes through the sample was determined using a Gurley densometer (manufactured by Toyo Seiki Seisaku-sho, Ltd.) according to JIS P 8117. The results are shown in Table 1.

[Porosity]

The ratio between the weight of fine particles and the total weight of the resin (polyamideimide) and the fine particles used in the production of a filtration filter was taken as the porosity (% by weight) of the filtration filter. The results are shown, in Table 1.

[Stress and Breaking Elongation]

A small piece having a size of 4 mm×30 mm was cut out from the polyimide porous membrane (PIm (2)), whereby a strip shape sample was obtained.

The stress (MPa; tensile strength) and the breaking elongation (% GL) at the time of break of the sample were evaluated respectively, using an EZ Test (testing machine, manufactured by Shimadzu Corporation) under the measurement conditions of 5 mm/min. These results are shown in Table 1.

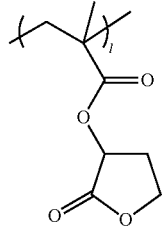

(A)-1

TABLE 1

| Filtration filter | Porous membrane | Preparation of varnish Silica dispersing solution | Baking of unbaked composite membrane Baking temperature (° C.) | Etching CE | Rebaking temperature (° C.) | Imidation ratio (%) | Gurley air permeability (seconds) | Porosity (% by weight) | Stress (MPa) | Braking elongation (% GL) |
|---|---|---|---|---|---|---|---|---|---|---|
| Filtration filter (1) | Polyimide porous membrane (PIm (2)) | Silica (1) | 400 | Condition 1 | 380 | 1.51 | 232.5 | 70 | 27.3 | 52.5 |

<Production (1) of Purified Resist Composition Product>

Example 1 and Comparative Examples 1 to 3

By mixing respective components shown in Table 2 and dissolving these, a resist liquid (1) was prepared, and by filtering the resist liquid (1) through each filtration filter shown in Table 1, purified resist composition products (concentration of the solid content of 7.5% by weight) were prepared, respectively.

TABLE 2

| | Resist solution (1) | | | | | |
|---|---|---|---|---|---|---|
| | Component (A) | Component (S) | Component (B) | Component (D) | Component (E) | Filter |
| Example 1 | (A)-1 [100] | (S)-1 [1300] | (B)-1 [3.6] | (D)-1 [0.4] | (E)-1 [1.1] | (1) |
| Comparative Example 1 | | | | | | (2) |
| Comparative Example 2 | | | | | | (3) |
| Comparative Example 3 | | | | | | (4) |

In Table 2, each abbreviation has the following meanings. The values in brackets [ ] indicate the amount (in terms of parts by weight) of the component added.

(A)-1: a polymeric compound represented by Chemical Formula (A)-1 shown below. The standard polystyrene conversion weight average molecular weight (Mw) determined by GPC was 10100, and the molecular weight dispersity (Mw/Mn) was 1.62. The copolymerization composition ratio (ratio of the respective structural units in the structural formula (molar ratio)) determined by carbon 13 nuclear magnetic resonance spectra (600 MHz_$^{13}$C-NMR) was l/m/n=40/40/20.

-continued

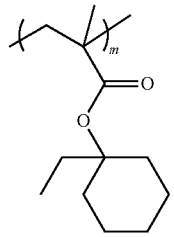

-continued

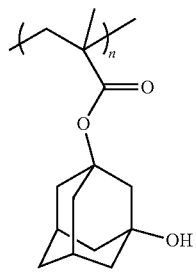

(S)-1: a mixed solvent of propylene glycol monomethyl ether acetate/propylene glycol monomethyl ether=60/40 (weight ratio).

(B)-1: an acid generator consisting of a compound represented by Chemical Formula (B)-1 shown below.

(D)-1: tri-n-octylamine.

(E)-1: salicylic acid.

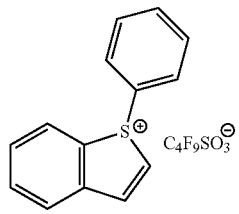

(B)-1

Example 1

By filtering the resist solution (1) through the filtration filter (1) provided with a polyimide porous membrane (PIm (2)), a purified resist composition product was obtained.

Filtration conditions: Filtration pressure of 0.3 kgf/cm$^2$ (2.94 N/cm$^2$), temperature of 23° C.

Comparative Example 1

By filtering the resist solution (1) through the filtration filter (2) provided with a polyamide (nylon) porous membrane (PAm (d)), a purified resist composition product was obtained.

Filtration conditions: filtration pressure of 0.3 kgf/cm$^2$ (2.94 N/cm$^2$), temperature of 23° C.

Comparative Example 2

By filtering the resist solution (1) through the filtration filter (3) provided with a polyamide (nylon) porous membrane (PAm (pou)), a purified resist composition product was obtained.

Filtration conditions: filtration pressure of 0.3 kgf/cm$^2$ (2.94 N/cm$^2$), temperature of 23° C.

Comparative Example 3

By filtering the resist solution (1) through the filtration filter (4) provided with a polyethylene porous membrane (PEm (pou)), a purified resist composition product was obtained.

Filtration conditions: filtration pressure of 0.3 kgf/cm$^2$ (2.94 N/cm$^2$), temperature of 23° C.

«Evaluation (1) of Purified Resist Composition Product»

A resist pattern was formed using the purified resist composition product obtained by filtration through a filtration filter in each example, and evaluation of defects was performed as follows.

[Formation of Resist Pattern]

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Next, the purified resist composition products obtained by filtration by the filtration methods of Example 1 and Comparative Examples 1 to 3 were applied to the organic anti-reflection film using a spinner, respectively, then, a prebake (PAB) treatment was performed on a hot plate at 110° C. for 60 seconds, and drying was performed, whereby a resist film having a film thickness of 80 nm was formed.

Next, the resist film was selectively irradiated with an ArF excimer laser (193 nm) through a 6% half-tone mask using an ArF exposure apparatus NSR-S609B (manufactured by Nikon Corporation; NA (number of apertures)=1.07; Cross pole).

Next, a post exposure bake (PEB) treatment was performed at 95° C. for 60 seconds, then, the resulting product was alkali-developed with a 2.38% by weight tetramethylammonium hydroxide (TMAH) aqueous solution at 23° C. for 10 seconds and rinsed with pure water for 15 seconds, and shake-off drying was performed. Further, a post bake was conducted at 100° C. for 45 seconds.

As a result, in each of the examples, a line and space pattern (LS pattern) having a line width of 45 nm and a pitch of 100 nm was formed.

[Evaluation of Defects (Number of Defects)]

With respect to the obtained LS pattern, the total number of defects within the wafer (total number of defects) was determined using a surface defect observation apparatus (product name: KLA2371; manufactured by KLA-TENCOR CORPORATION). The results are shown in Table 3. For each example, 2 wafers were measured, and an average value of the measured values was determined as the number of defects.

TABLE 3

| | Filter | PAB (° C.) | PEB (° C.) | Number of defects (relative value when the number of defects in Example 1 is 1) |
|---|---|---|---|---|
| Example 1 | (1) | 110 | 95 | 1 |
| Comparative Example 1 | (2) | 110 | 95 | 200 |
| Comparative Example 2 | (3) | 110 | 95 | 190 |
| Comparative Example 3 | (4) | 110 | 95 | 50 |

From the results shown in Table 3, it could be confirmed that by applying the present invention, generation of defects was more reliably suppressed, and deficiencies such as generation of scums and microbridges were reduced.

Production (2) of Purified Resist Composition Product

Examples 2 and 3 and Comparative Examples 4 and 5

By mixing respective components shown in Table 4 and dissolving these, a resist liquid (2) was prepared, and by filtering the resist liquid (2) through each filtration filter, purified resist composition products (concentration of the solid content of 7.5% by weight) were prepared, respectively.

TABLE 4

| | Resist solution (2) | | | | | Filtration filter | |
|---|---|---|---|---|---|---|---|
| | Component (A) | | Component (S) | Component (B) | Additive | | |
| Example 2 | (A)-2 [70] | (A)-3 [30] | (S)-2 [600] | (B)-2 [5.0] | Add-1 [2.0] | Add-2 [0.05] | (1) |
| Comparative Example 4 | | | | | | | (2) |
| Example 3 | | | | | | | (2) (1) |
| Comparative Example 5 | | | | | | | (2) (4) |

In Table 4, each abbreviation has the following meanings. The values in brackets [ ] indicate the amount (in terms of parts by weight) of the component added.

(A)-2: a polymeric compound represented by the following Chemical Formula (A)-2. The standard polystyrene conversion weight average molecular weight (Mw) determined by GPC was 25000, and the molecular weight dispersity (Mw/Mn) was 4.5. The copolymerization composition ratio (ratio of the respective structural units in the structural formula (molar ratio)) determined by carbon 13 nuclear magnetic resonance spectra (600 MHz_$^{13}$C-NMR) was l/m/n/o=70/5/20/5.

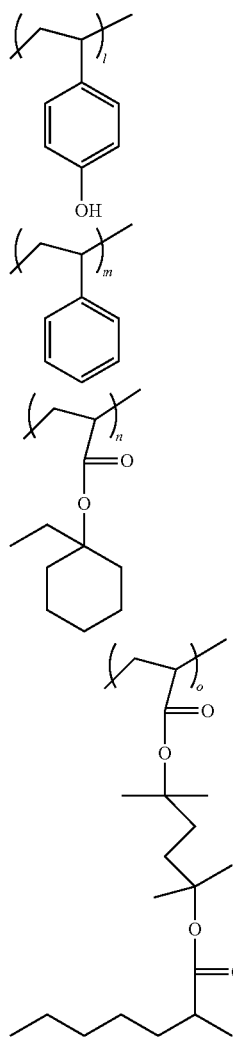

(A)-2

(A)-3: Polymeric compound represented by Chemical Formula (A)-3 shown below. The standard polystyrene conversion weight average molecular weight (Mw) determined by GPC was 8500, and the molecular weight dispersity (Mw/Mn) was 2.0. The copolymerization composition ratio (ratio of the respective structural units in the structural formula (molar ratio)) determined by carbon 13 nuclear magnetic resonance spectra (600 MHz_$^{13}$C-NMR) was l/m/n=65/15/20.

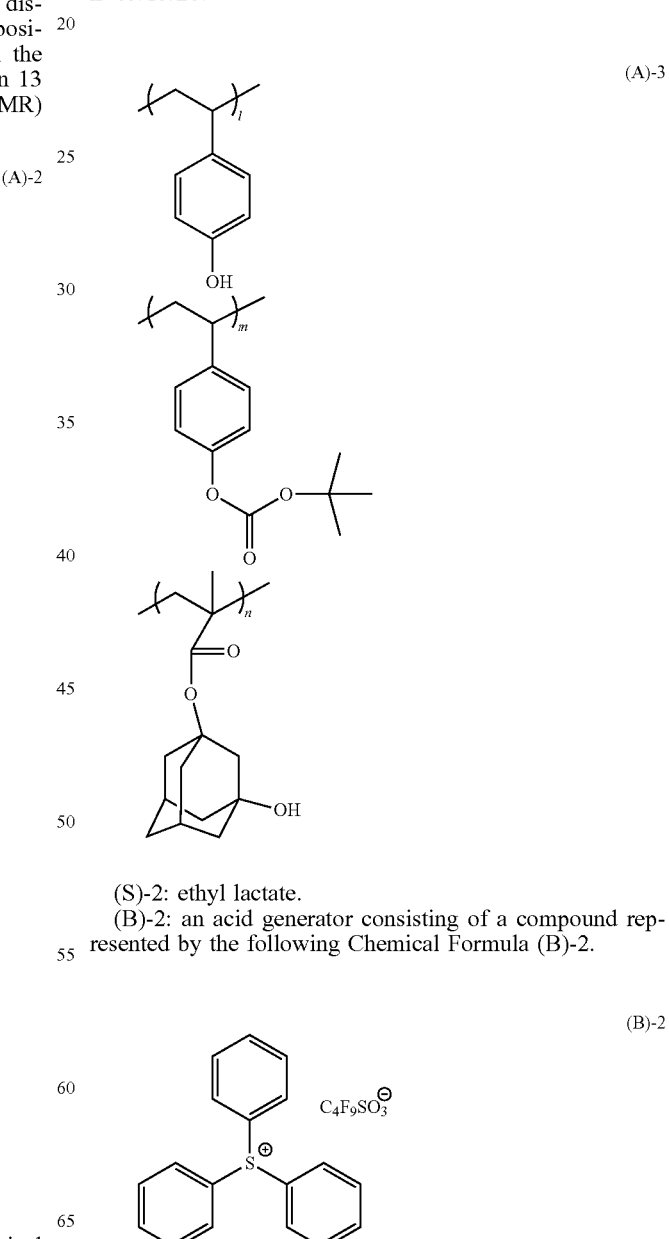

(S)-2: ethyl lactate.
(B)-2: an acid generator consisting of a compound represented by the following Chemical Formula (B)-2.

Add-1: a compound represented by the following Chemical Formula (Add)-1.

Add-2: a surfactant. Product Name MEGAFAC XR-104 (manufactured by DIC Corporation).

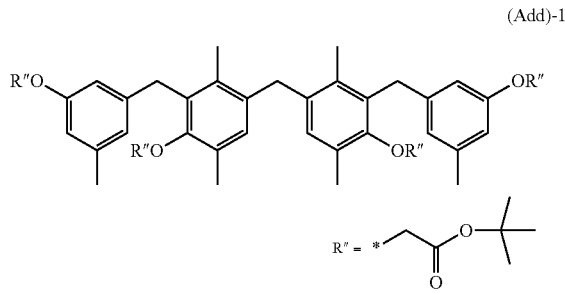

(Add)-1

Example 2

By filtering the resist solution (2) through the filtration filter (1) provided with a polyimide porous membrane (PIm (2)), a purified resist composition product was obtained.

Filtration conditions: filtration pressure of 0.3 kgf/cm$^2$ (2.94 N/cm$^2$), temperature of 23° C.

Comparative Example 4

By filtering the resist solution (2) through the filtration filter (2) provided with a polyamide (nylon) porous membrane (PAm (d)), a purified resist composition product was obtained.

Filtration conditions: filtration pressure of 0.3 kgf/cm$^2$ (2.94 N/cm$^2$), temperature of 23° C.

Example 3

By filtering the purified resist composition product obtained in Comparative Example 4 through the filtration filter (1) provided with the polyimide porous membrane (PIm (2)), a target purified resist composition product was obtained.

Filtration conditions of the filtration filter (1): filtration pressure of 0.3 kgf/cm$^2$ (2.94 N/cm$^2$), temperature of 23° C.

Comparative Example 5

By filtering the purified resist composition product obtained in Comparative Example 4 through the filtration filter (4) provided with the polyethylene porous membrane (PEm (pou)), a target purified resist composition product was obtained.

Filtration conditions of the filtration filter (4): filtration pressure of 0.3 kgf/cm$^2$ (2.94 N/cm$^2$), temperature of 23° C.

«Evaluation (2) of Purified Resist Composition Product»

A resist pattern was formed using the purified resist composition product obtained by filtration through a filtration filter in each example, and evaluation of defects was performed as follows.

[Formation of Resist Pattern]

A known organic anti-reflection film composition was applied to an 8-inch silicon wafer using a spinner, the composition, was baked at 205° C. for 60 seconds on a hot plate, drying was performed, and an organic anti-reflection film having a film thickness of 120 nm formed, whereby an organic anti-reflection film-coated substrate was manufactured.

Next, the purified resist composition products produced by the production methods of Examples 2 and 3 and Comparative Examples 4 and 5 were applied to the organic anti-reflection film-coated substrate using a spinner, respectively, then, a prebake (PAB) treatment was performed on a hot plate at a temperature of 110° C. for 60 seconds, and drying was performed, whereby a resist film having a film thickness of 400 nm was formed.

Next, the resist film was selectively irradiated with a KrF excimer laser (248 nm) through a mask pattern (binary mask) using an exposure apparatus NSR-S205C (manufactured by Nikon Corporation; NA=0.75; ½ annular).

Next, a post exposure bake (PEB) treatment was performed at 140° C. for 60 seconds, and alkali development was performed with a 2.38% by weight tetramethylammonium hydroxide (TMAH) aqueous solution (product name "NMD-3", manufactured by TOKYO OHKA KOGYO CO., LTD.) at 23° C. for 60 seconds.

Thereafter, post bake was performed at 130° C. for 60 seconds.

As a result, in all of the examples, a line and space pattern (LS pattern) having a line width of 200 nm and a pitch of 400 nm was formed.

[Evaluation of Defects (Number of Defects)]

With respect to the obtained LS pattern, the total number of defects within the wafer (total number of defects) was determined using a surface defect observation apparatus (product name: KLA2371; manufactured by KLA-TENCOR CORPORATION). The results are shown in Table 5. For each example, 2 wafers were measured, and an average value of the measured values was determined as the number of defects.

TABLE 5

|  | Filtration filter | | PAB (° C.) | PEB (° C.) | Number of defects (relative value when the number of defects in Example 1 is 1) |
|---|---|---|---|---|---|
| Example 2 | (1) | | 110 | 140 | 1 |
| Comparative Example 4 | (2) | | 110 | 140 | 20 |
| Example 3 | (2) | (1) | 110 | 140 | 1 |
| Comparative Example 5 | (2) | (4) | 110 | 140 | 5 |

From the results shown in Table 5, it could be confirmed that by applying the present invention, generation of defects was more reliably suppressed, and deficiencies such as generation of scums and microbridges were reduced.

BRIEF DESCRIPTION OF THE DRAWINGS 1 spherical cell, 1a spherical cell, 1b spherical cell, 5 communicating pore, 10 (polyimide resin) porous membrane.

What is claimed is:

1. A filtration filter used for filtering a liquid chemical for lithography, the filtration filter comprising a polyimide resin porous membrane having a porous structure in which adjacent spherical cells are mutually communicating so as to form a flow path through which the liquid chemical can flow from one side of the membrane to the other side of the membrane, said membrane having a total porosity of 60 to 90% by weight, wherein the average pore diameter of all pores in the polyimide resin porous membrane is from 100 to 2000 nm.

2. A filtration method comprising: allowing a liquid chemical for lithography to pass through the filtration filter of claim 1.

3. A method of producing a purified liquid chemical product for lithography, comprising:
filtering a liquid chemical for lithography by the filtration method of claim 2.

4. The method according to claim 3, wherein filtering a liquid chemical for lithography includes an operation of allowing the liquid chemical for lithography to pass through the filter by pressure difference.

5. The method according to claim 3, wherein the liquid chemical for lithography is a resist composition comprising a base component (A) which exhibits changed solubility in an alkali developing solution under action of acid and an organic solvent (S), and having an acid generation ability.

6. The method according to claim 5, wherein the base component (A) comprises a polymeric compound (A1) having a structural unit (ap) containing a polar group.

7. The filtration filter of claim 1, wherein the membranes are formed by including and removing fine particles having a particle size distribution index (d25/d75) of 1.6 to 5.

8. A method of forming a resist pattern, comprising:
filtering a resist composition comprising a base component (A) which exhibits changed solubility in an alkali developing solution under action of acid and an organic solvent (S), and having an acid generation ability by a filter comprising a polyimide resin porous filter membrane having a porous structure in which adjacent spherical cells are mutually communicating so as to form a flow path through which the liquid chemical can flow from one side of the membrane to the other side of the membrane, said membrane having a total porosity of 60 to 90% by weight to obtain a purified resist composition product, wherein the average pore diameter of all pores in the polyimide resin porous membrane is from 100 to 2000 nm;
using the purified resist composition product to form a resist film on a substrate;
exposing the resist film; and
developing the exposed resist film to form a resist pattern.

9. The method of claim 8, wherein the membranes are formed by including and removing fine particles having a particle size distribution index (d25/d75) of 1.6 to 5.

10. A filtration filter used for filtering a liquid chemical for lithography, the filtration filter having a porous structure in which adjacent spherical cells are mutually communicating so as to form a flow path through which the liquid chemical can flow from one side of the membrane to the other side of the membrane, and comprising a polyimide resin porous membrane wherein the average diameter of all of the spherical cells in the polyimide resin porous membrane is from 50 to 2,000 nm, and the filtration filter has a total porosity of 60 to 90% by weight.

11. The filtration filter according to claim 10, which is provided with a thermosetting resin porous membrane.

12. A filtration method comprising: an operation of allowing a liquid chemical for lithography to pass through the filtration filter of claim 10.

13. A method of producing a purified liquid chemical product for lithography, comprising: filtering a liquid chemical for lithography by the filtration method of claim 12.

14. The method according to claim 13, wherein the filter is provided with a thermosetting resin porous membrane.

15. The method according to claim 13, wherein the liquid chemical for lithography is a resist composition comprising a base component (A) which exhibits changed solubility in an alkali developing solution under action of acid and an organic solvent (S), and having an acid generation ability.

16. The method according to claim 15, wherein the base component (A) comprises a polymeric compound (A1) having a structural unit (ap) containing a polar group.

17. The filtration filter of claim 10, wherein the membranes are formed by including and removing fine particles having a particle size distribution index (d25/d75) of 1.6 to 5.

18. A method of forming a resist pattern, comprising:
filtering a resist composition comprising a base component (A) which exhibits changed solubility in an alkali developing solution under action of acid and an organic solvent (S), and having an acid generation ability with a filter comprising a polyimide resin porous membrane having a porous structure in which adjacent spherical cells are mutually communicating so as to form a flow path through which the liquid chemical can flow from one side of the membrane to the other side of the membrane to obtain a purified resist composition product, wherein the average diameter of all of the spherical cells in the polyimide resin porous membrane is from 50 to 2,000 nm, and the filtration filter has a porous structure in which adjacent spherical cells are mutually communicating and a total porosity of 60 to 90% by weight;
forming a resist film on a substrate using the purified resist composition product;
exposing the resist film; and
developing the exposed resist film to form a resist pattern.

19. The method of claim 18, wherein the membranes are formed by including and removing fine particles having a particle size distribution index (d25/d75) of 1.6 to 5.

* * * * *